(12) United States Patent
Tonosaki et al.

(10) Patent No.: US 6,840,310 B2
(45) Date of Patent: Jan. 11, 2005

(54) COOLING DEVICE, ELECTRONIC APPARATUS AND ACOUSTIC APPARATUS, AND METHOD FOR PRODUCING THE COOLING DEVICE

(75) Inventors: Minehiro Tonosaki, Kanagawa (JP); Eisaku Kato, Tokyo (JP); Motosuke Ohmi, Tokyo (JP); Takashi Yajima, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/608,367

(22) Filed: Jun. 30, 2003

(65) Prior Publication Data

US 2004/0069459 A1 Apr. 15, 2004

(30) Foreign Application Priority Data

Jul. 5, 2002 (JP) .................................... 2002-198023
Dec. 12, 2002 (JP) .................................... 2002-361393

(51) Int. Cl.[7] ............................................. F28D 15/00
(52) U.S. Cl. ........................... 165/104.21; 165/104.26; 165/104.33; 361/700; 174/15.2; 257/715
(58) Field of Search ..................... 165/104.21, 104.33, 165/80.4, 185; 361/699, 700; 174/15.1, 15.2; 257/714–716

(56) References Cited

U.S. PATENT DOCUMENTS

| | | | | |
|---|---|---|---|---|
| 4,602,679 A | * | 7/1986 | Edelstein et al. ........ | 165/104.26 |
| 5,394,936 A | * | 3/1995 | Budelman ............... | 165/104.33 |
| 5,441,102 A | * | 8/1995 | Burward-Hoy ......... | 165/104.25 |
| 5,704,416 A | * | 1/1998 | Larson et al. ........... | 165/104.33 |
| 5,725,049 A | * | 3/1998 | Swanson et al. ........ | 165/104.26 |
| 5,731,954 A | * | 3/1998 | Cheon .......................... | 361/699 |
| 5,764,483 A | * | 6/1998 | Ohashi et al. ............... | 361/699 |
| 6,029,742 A | * | 2/2000 | Burward-Hoy ............. | 165/80.4 |
| 6,223,810 B1 | * | 5/2001 | Chu et al. .............. | 165/104.33 |
| 6,241,008 B1 | * | 6/2001 | Dunbar .................. | 165/104.26 |
| 6,269,865 B1 | * | 8/2001 | Huang .................... | 165/104.26 |
| 6,330,907 B1 | * | 12/2001 | Ogushi et al. ......... | 165/104.26 |
| 6,533,029 B1 | * | 3/2003 | Phillips ................. | 165/104.26 |
| 6,564,861 B1 | * | 5/2003 | Miyazaki et al. ...... | 165/104.29 |
| 6,601,643 B2 | * | 8/2003 | Cho et al. .............. | 165/104.26 |

* cited by examiner

*Primary Examiner*—Terrell McKinnon
(74) *Attorney, Agent, or Firm*—Oblon, Spivak, McClelland, Maier & Neustadt, P.C.

(57) ABSTRACT

The present invention provides a cooling device having improved cooling performance and providing higher flexibility, an electronic apparatus and an acoustic apparatus employing the cooling device, and a method for producing the cooling device. The cooling device is provided with an evaporator that is capable of cooling an object to be cooled, and a condenser that is capable of releasing to the outside heat that has been absorbed during the cooling by the evaporator. A vapor-phase conduit and a liquid-phase conduit, both of which are made of fluorocarbon resin and through which an operating medium flows, are disposed between and coupled to the evaporator and the condenser, thereby circulating the operating medium.

26 Claims, 21 Drawing Sheets

COOLING DEVICE, ELECTRONIC APPARATUS AND ACOUSTIC APPARATUS, AND METHOD FOR PRODUCING THE COOLING DEVICE

BACKGROUND OF THE INVENTION

1. Field of the Invention

The present invention relates to a cooling device that is employed in applications such as cooling central processing units of personal computers or cooling power transistors used in amplifiers of acoustic apparatuses, relates to electronic apparatuses and acoustic apparatuses that employ the cooling device, and to methods for producing the cooling device.

2. Description of the Related Art

Advances in performances of central processing units (hereinafter called "CPUS" as required) have become considerable in recent years. On the other hand, the considerable advances in the performance of the CPUs have led to an increase in the amount of heat generated by the CPUs, and this larger amount of the heat eventually creates problems in that errors occur in the CPU.

CPUs are conventionally cooled by air-cooling by using a fan. However, the conventional air-cooling generally provides an insufficient cooling performance, and fans having higher cooling performances than the conventional fans may cause the more serious problem of noise.

Alternatively, cooling the CPU by circulating a cooling medium may be considered. However, sufficient cooling performance cannot be obtained by this technique. Further, such cooling-medium-circulating systems may increase the size of the apparatus configuration, thereby inhibiting its miniaturization.

These problems may also similarly occur in, for example, audio apparatuses that include power transistors requiring higher power, as well as in the personal computers.

Thus, the present inventors propose a technique of employing heat pipe as a means of cooling such apparatuses.

A heat pipe is a metal pipe having a capillary configuration on the inner wall of the pipe, and the interior of the pipe is substantially a vacuum but includes a smaller amount of water or substitutes for CFCs. When an end (vaporizing unit) of the heat pipe is heated by contacting a heat source, the liquid included within the heat pipe is evaporated, thereby absorbing heat as latent heat (vaporization heat). Then the vapor is transferred to a lower temperature unit (condensing unit) at a higher velocity (at substantially the sonic velocity), and the vapor is cooled to become a liquid again, thus emitting heat (heat emission by condensation latent heat). The liquid is then transferred back to the originating place through the capillary configuration (or by the force of gravity), and therefore, heat can be continuously transferred with high efficiency in this system.

However, the following problem occurs. Most of the heat pipes currently employed are small, and therefore, it is difficult for one heat pipe to sufficiently cool a large device such as the aforementioned CPU and audio apparatus, which consume a large amount of electric power, for example, 50 to 100 W or higher.

Further, another problem is that, since commonly used heat pipes often have a geometry in which the transfer channel for the operating medium of liquid/vapor phase is integrated with the vaporizing unit and the condensing unit, efficient cooling and heat releasing cannot be achieved when a specific object is cooled or when a specific arrangement of peripheral devices is used.

SUMMARY OF THE INVENTION

The present invention is made on the basis of the aforementioned situation, and it is an object of the present invention to provide a cooling device having improved cooling performance and providing higher flexibility for selecting a suitable device arrangement, electronic apparatus and acoustic apparatus employing the cooling device, and a method for producing the cooling device.

In order to solve these problems, according to an aspect of the present invention, there is provided a cooling device comprising: a cooling unit, which is capable of cooling an object by vaporizing an operating medium with heat from the object; a condensing unit, which is physically separated from the cooling unit, and capable of condensing the vaporized operating medium vaporized in the cooling unit to circulate the condensed operating medium to the cooling unit; a first tube, through which the condensed operating medium flows from the condensing unit to the cooling unit; and a second tube, through which the vaporized operating medium flows from the cooling unit to the condensing unit.

According to the constitution thereof, higher cooling efficiency can be achieved, since the heat generated from the object is absorbed by the cooling medium, and the vaporized medium that is vaporized with the heat is circulated through the tube to the condensing unit that is physically separated from the cooling unit, where the heat of the vapor is released. Further, since the cooling unit is physically separated from the condensed unit, higher level of the flexibility for selecting the device arrangement can be obtainable.

According to one configuration of the present invention, the cooling unit may comprise: a first substrate that is provided with a groove of other than wick; a second substrate that is formed of a metal or a material having a thermal conductivity equivalent to that of a metal, and is provided with at least a wick; and a third substrate that has a surface incorporating the second substrate, wherein the surface of the third substrate is joined with the first substrate. According to the constitution thereof, efficient vaporization of the operating medium can be achieved, thereby efficiently cooling the object.

According to one configuration of the present invention, the second substrate may be formed of copper, and a thin film of copper I oxide is formed on the wick surface.

According to the constitution thereof, since the wick surface is formed of copper I oxide, the hydrophilicity of the surface improves and the capillary attraction thereof improves. Thus, the amount of the vaporized operating medium improves, thereby improving the cooling efficiency. Further, the better hydrophilicity improves the corrosion resistance thereof, and since the improved corrosion resistance prevents the corrosion of the metal material, the thickness of the potentially-corroded part of the present invention can be formed thinner than the conventional potentially-corroded part, which is formed taking account of the corrosion of the metallic part. Therefore, miniaturization and lower-profiling can be achieved. Also, since the surface of the copper I oxide provides an antibacterial action, the operating medium is usually maintained to be clean, and the deterioration of the operating medium is prevented.

According to one configuration of the present invention, at least one of the first tube and the second tube may be formed of a fluorocarbon resin.

Since the fluorocarbon resin has a flexibility, and can be flexibly clinched, flexible arrangement of the cooling unit and the condensing unit is achieved. Further, since the fluorocarbon resin provides higher flow ability of the vapor phase/liquid phase, and since the resin has higher resistance to vapor/liquid, the efficiency of the transportation of the operating medium can be improved.

According to one configuration of the present invention, joints between a unit and a tube may be coated with a self-bonding fluorocarbon resin, wherein the unit is selected from the group consisting of the cooling unit and the condensing unit, and wherein the tube is selected from the group consisting of the first tube the second tube. According to the constitution thereof, the air-tightness of the joint improves. In particular, when the tube is made of a fluorocarbon resin, higher air-tightness can be achieved, since the self-bonding fluorocarbon resin of the coating causes a polymerization with the fluorocarbon resin of the tube.

According to one configuration of the present invention, at least one surface of the joint of a tube with a unit may be treated with plasma or reactive ion etching, wherein the tube is selected from the group consisting of the first tube and the second tube, and wherein the unit is selected from the group consisting of the cooling unit and the condensing unit. This constitution provides improved adhesiveness and air-tightness. At least one surface of said joint of a tube with a unit may be treated with plasma or reactive ion etching, wherein said tube is selected from the group consisting of said first tube and the second tube, and wherein said unit is selected from the group consisting of said cooling unit and said condensing unit. In particular, the surface treatment with hydrogen plasma provides advantages of lower cost, higher productivity and less emission of toxic wastes than the wet etch using alkali metal ions and so on.

According to one configuration of the present invention, surfaces of the first tube and the second tube may have a metal thin film formed thereon. The constitution provides improved air-tightness of the tubes. In particular, the treatment of the metal thin film-formed surface of the fluorocarbon resin tubes with hydrogen plasma provides improved adhesiveness between the tube and the metal thin film. The metal thin film may preferably contain at least one of Cu, Al, Ni, Ti, Au, Pt, Ag, Cr, Fe, Zn, Co, Si, Sn, In and Pb.

The methods of forming the metal thin film may include vacuum deposition, sputtering, electroless plating, electrolytic plating and so on.

According to one configuration of the present invention, the first tube and the second tube may contain at least one selected from the group consisting of silicone rubber, polyurethane and polypropylene. The constitution provides improved adhesiveness and also provides favorable choice for preferred adhesives, thereby presenting facilitated jointing therewith. In particular, silicone is preferable for adapting to the tube for liquid phase, since silicone has higher hydrophilicity. Therefore, the preferable configuration may be, for example, using silicone for the first tube, through which the condensed operating medium flows from the condensing unit to the cooling unit, and using TEFLON® having higher water repellency, polyurethane or polypropylene for the second tube, through which the vaporized operating medium flows from the cooling unit to the condensing unit.

According to one configuration of the present invention, at least one of outer and inner surfaces of the first tube and the second tube may be coated with a fluorocarbon resin. For example, outer and inner surfaces of the tube can be coated with fluorocarbon resin by using electroless plating. According to the constitution thereof, the air-tightness of the tube improves.

A second aspect of the invention is an electronic apparatus including: a central processing unit; a cooling unit, which is disposed adjacent to the central processing unit, has a wick constitution, and is capable of cooling an object by vaporizing an operating medium with heat from the object; a condensing unit, which is physically separated from the cooling unit, and is capable of condensing the vaporized operating medium vaporized in the cooling unit circulating the condensed operating medium to the cooling unit; a first tube, through which the condensed operating medium flows from the condensing unit to the cooling unit; and a second tube, through which the vaporized operating medium flows from the cooling unit to the condensing unit.

This constitution provides miniaturization and lower profiling without occurring a false operation of the electronic apparatus itself, since the electronic apparatus can have the cooling device on board, which provides higher cooling performances and flexible arrangement of the units.

According to one configuration of the present invention, the cooling unit may have an area that is substantially equal to the area of the central processing unit.

This constitution provides efficient cooling of the heat generated from the central processing unit having larger scale of the capacity, thereby efficiently preventing the operation false of the apparatus.

Another aspect of the invention is an electronic apparatus having a slot, through which a card memory device comprising a flash memory and a driver is capable of inserted therein or removed therefrom, and the electronic device includes: a cooling unit, which is disposed adjacent to the slot, and is capable of cooling an object by vaporizing an operating medium with heat from the object; a condensing unit, which is physically separated from the cooling unit, and is capable of condensing the vaporized operating medium vaporized in the cooling unit circulating the condensed operating medium to the cooling unit; a first tube, through which the condensed operating medium flows from the condensing unit to the cooling unit; and a second tube, through which the vaporized operating medium flows from the cooling unit to the condensing unit.

This constitution provides efficient cooling of, not only the above-mentioned central processing unit but also the other built-in devices of higher wattage, and also provides flexible arrangement of the units, thereby improving the performances of the electronic apparatus.

According to one configuration of the present invention, an electronic apparatus may comprise: an operating unit having at least a central processing unit; a cooling unit, which is disposed adjacent to the central processing unit, and is capable of cooling an object by vaporizing an operating medium with heat from the object; a displaying unit, which is physically separated from the cooling unit, and has a condensing unit that is capable of condensing the vaporized operating medium vaporized in the cooling unit; a coupling unit, capable of collapsiblly coupling a side of the operating unit and a side of the displaying unit; a first tube disposed between the condensing unit and the cooling unit by the coupling unit, wherein the condensed operating medium flows from the condensing unit to the cooling unit through the first tube; and a second tube disposed between the condensing unit and the cooling unit by the coupling unit, wherein the vaporized operating medium flows from the cooling unit to the condensing unit through the second tube.

This constitution can provide an arrangement of the units for the electronic apparatus having a collapse-able shape, in which an operation of cooling of the object to be cooled such as central processing unit is conducted in the operating unit, and an operation of releasing the heat that has been formerly taken from the object is conducted in the displaying unit, thereby improving the cooling efficiency of the electronic apparatus and the flexibility of the arrangement of the unit in the electronic apparatus.

A third aspect of the invention is an acoustic apparatus having a power transistor, which comprises: a cooling unit, which is capable of cooling the power transistor by vaporizing an operating medium with heat from the object; a condensing unit, which is physically separated from the cooling unit, and is capable of condensing the vaporized operating medium vaporized in the cooling unit and circulating the condensed operating medium to the cooling unit; a first tube, through which the condensed operating medium flows from the condensing unit to the cooling unit; and a second tube, through which the vaporized operating medium flows from the cooling unit to the condensing unit.

According to this aspect of the present invention, the aforementioned cooling operation by using the cooling device having higher cooling performance and higher flexibility for the arrangement of the units can be achieved, thereby improving the performance of the acoustic apparatus and achieving miniaturization of the apparatus. Further, the constitution can eliminate the noise generated from cooling fans, and therefore sound quality of the acoustic apparatus can also be improved.

A fourth aspect of the invention is a method for producing a cooling device, which comprises: producing a cooling unit, which is capable of cooling an object by vaporizing an operating medium with heat from the object; producing a condensing unit, which is physically separated from the cooling unit, and is capable of condensing the vaporized operating medium vaporized in the cooling unit and circulating the condensed operating medium to the cooling unit; coupling a first tube between the cooling unit and the condensing unit, wherein the condensed operating medium is capable of flowing from the condensing unit to the cooling unit through the first tube; and coupling a second tube between the cooling unit and the condensing unit, wherein the vaporized operating medium is capable of flowing from the cooling unit to the condensing unit through the second tube.

This constitution can ensure the efficient production of the aforementioned cooling device having higher cooling performance and higher flexibility for the arrangement of the units.

According to one configuration of the present invention, the step of producing the cooling unit may further comprise forming a thin film of copper I oxide on a wick surface. This improves the hydrophilicity of the wick surface, thereby providing the production of the wick that has improved fluidize-ability for the operating medium.

According to one configuration of the present invention, the first tube and the second tube may be formed of a fluorocarbon resin. This provides the coupling of the cooling unit with the condensing unit by a tube having flexibility, thereby achieving the production of the cooling device in which various unit arrangements can be made.

According to one configuration of the present invention, the method may further comprise: forming a coating of self-bonding fluorocarbon resin onto at least one of joints between a unit and a tube, wherein the unit is selected from the group consisting of the cooling unit and the condensing unit, and wherein the tube is selected from the group consisting of the first tube the second tube. According to the constitution thereof, the air-tightness of the joint improves. In particular, when the tube is made of a fluorocarbon resin, higher air-tightness can be achieved, since the self-bonding fluorocarbon resin of the coating causes a polymerization with the fluorocarbon resin of the tube.

According to one configuration of the present invention, the method may further comprise: treating the fluorocarbon resin surface with hydrogen plasma. This constitution provides improved adhesiveness and air-tightness. In particular, the surface treatment with hydrogen plasma provides advantages of lower cost, higher productivity and less emission of toxic wastes than the wet etch using alkali metal ions and so on.

According to one configuration of the present invention, the method may further comprise: forming a metal thin film on at least one of surfaces of the first tube and the second tube. The constitution provides improved air-tightness of the tubes. In particular, the treatment of the metal thin film-formed surface of the fluorocarbon resin tubes with hydrogen plasma provides improved adhesiveness between the tube and the metal thin film. The metal thin film may preferably contain at least one of Cu, Al, Ni, Ti, Au, Pt, Ag, Cr, Fe, Zn, Co, Si, Sn, In and Pb.

According to one configuration of the present invention, at least one of the first tube and the second tube may contain at least one material selected from the group consisting of silicone rubber, polyurethane and polypropylene. The constitution provides improved adhesiveness and also provides favorable choice for preferred adhesives, thereby presenting facilitated jointing therewith. In particular, silicone is preferable for adapting to the tube for liquid phase, since silicone has higher hydrophilicity. Therefore, the preferable configuration may be, for example, using silicone for the first tube, through which the condensed operating medium flows from the condensing unit to the cooling unit, and using TEFLON® having higher water repellency, polyurethane or polypropylene for the second tube, through which the vaporized operating medium flows from the cooling unit to the condensing unit.

According to one configuration of the present invention, the method may further comprise: forming a coating of fluorocarbon resin on at least one of outer and inner surfaces of the first tube and the second tube. For example, outer and inner surfaces of the tube can be coated with fluorocarbon resin by using electroless plating. According to the constitution thereof, the air-tightness of the tube improves.

DESCRIPTION OF THE PREFERRED EMBODIMENTS

The preferred embodiments of the present invention will be described bellow.

Figure 1:
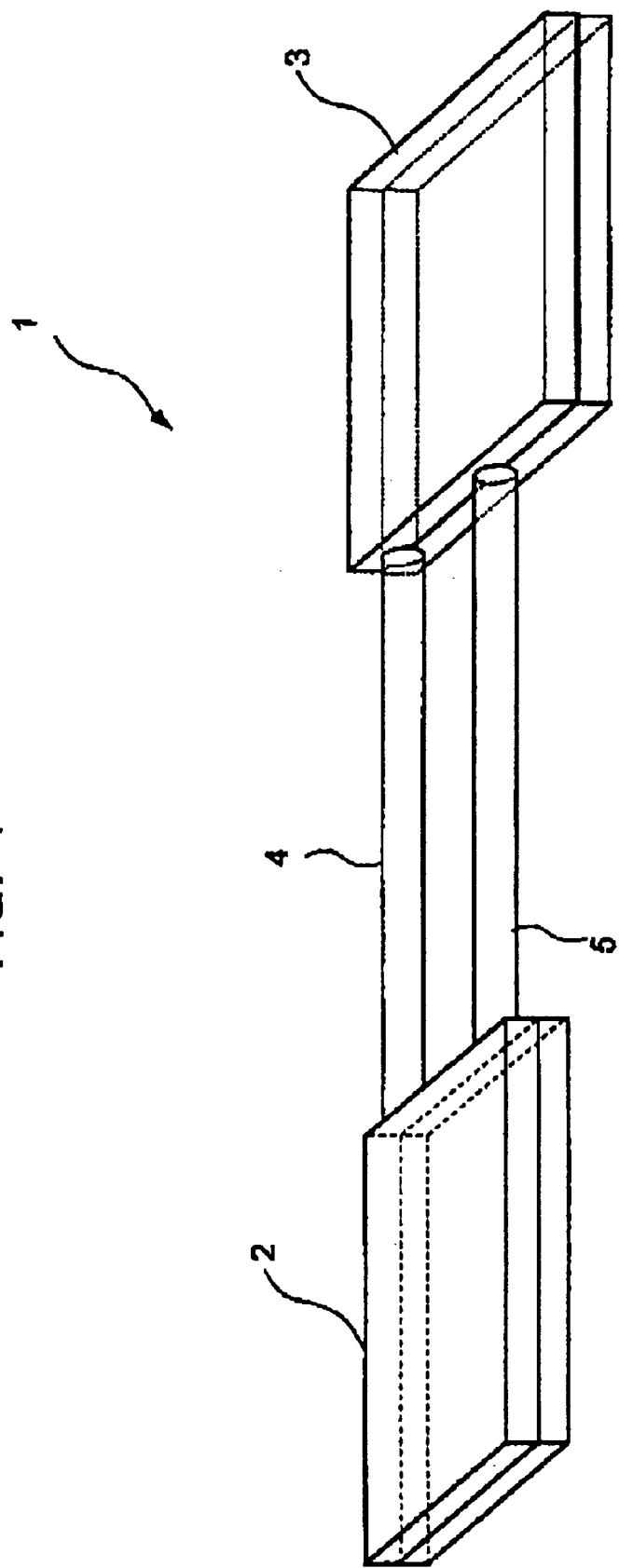
FIG. 1 is a schematic diagram showing the whole structure of the cooling device according to the present invention.
Figure 2:
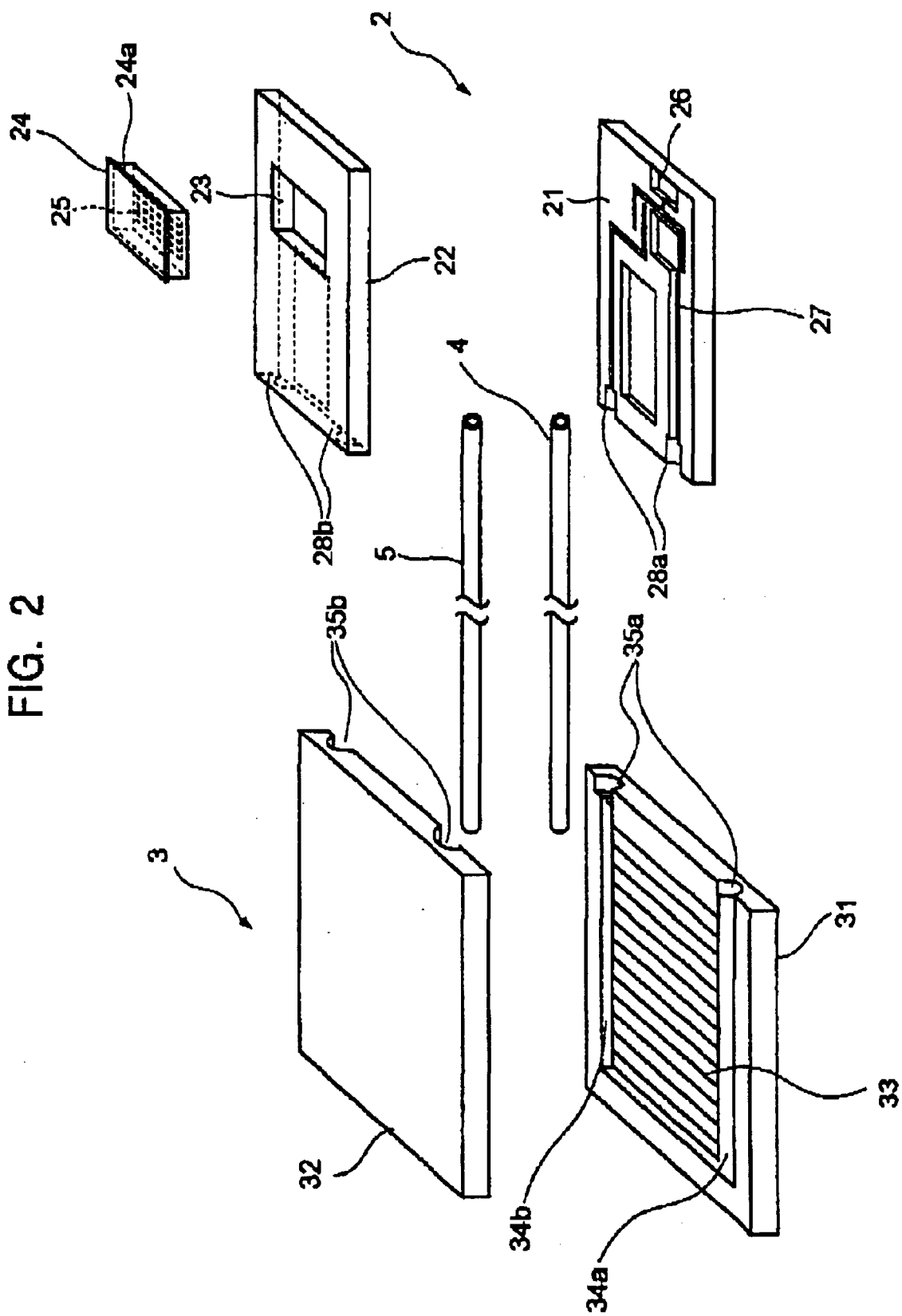
FIG. 2 is an exploded perspective diagram showing the structure of the cooling device according to the present invention.

FIG. 1 is a schematic diagram showing the whole structure of a cooling device according to one conformation of the present invention. FIG. 2 is an exploded diagram of the cooling device.

As shown in FIG. 1, the cooling device 1 is provided with an evaporator 2 that is capable of cooling an object to be cooled, such as a central processing unit of a personal computer and so on, and a condenser 3 that is capable of releasing to the outside heat that has been absorbed during the cooling by the evaporator 2. A vapor-phase conduit 4 and a liquid-phase conduit 5 are disposed between and coupled to the evaporator 2 and the condenser 3 for circulating an operating medium therein (not shown).

Figure 3:
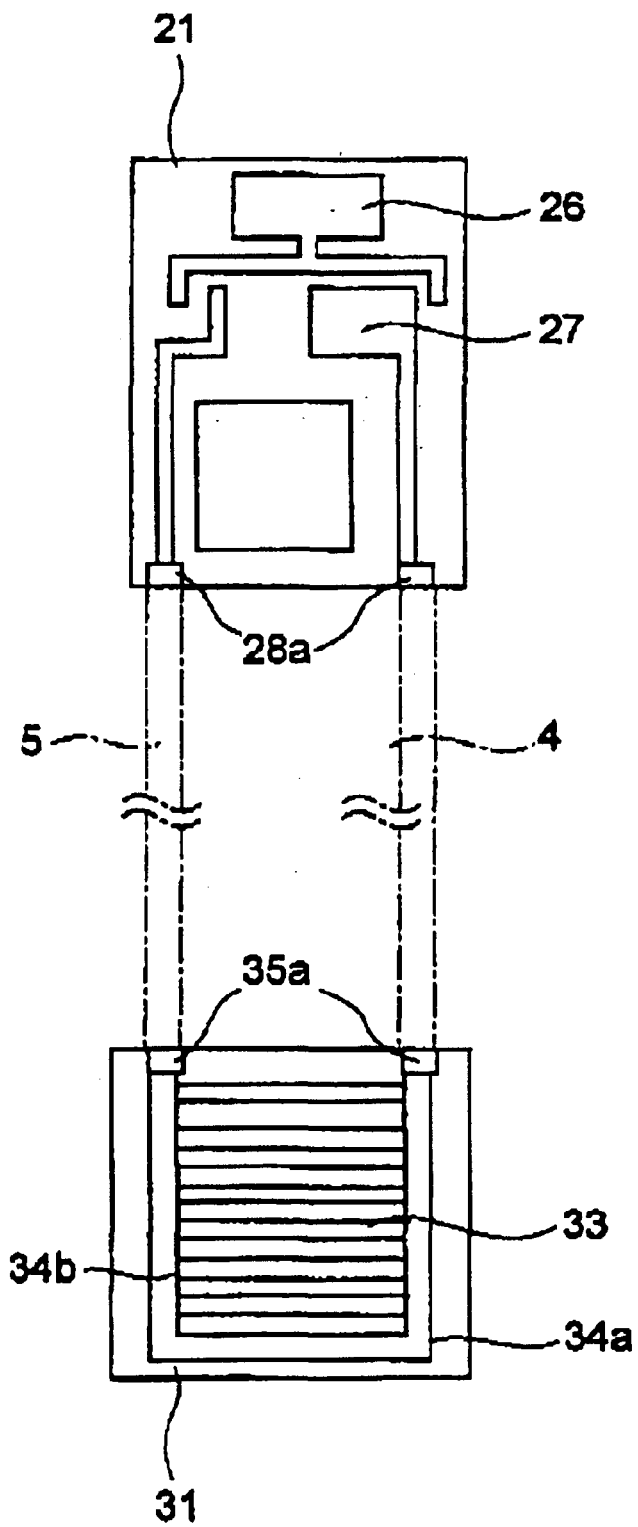
FIG. 3 is a plan view showing the channel substrates of the cooling device according to the present invention.
Figure 4:
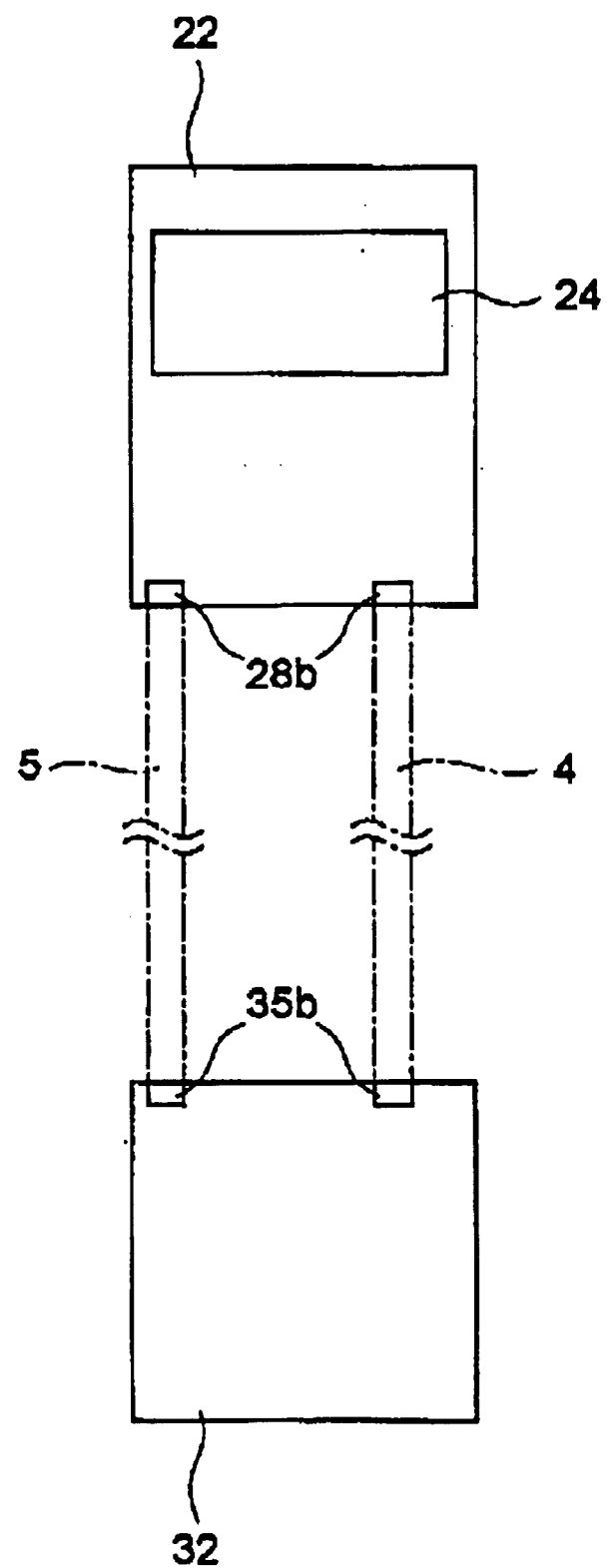
FIG. 4 is a plan view showing the opposite substrates of the cooling device according to the present invention.
Figure 5:
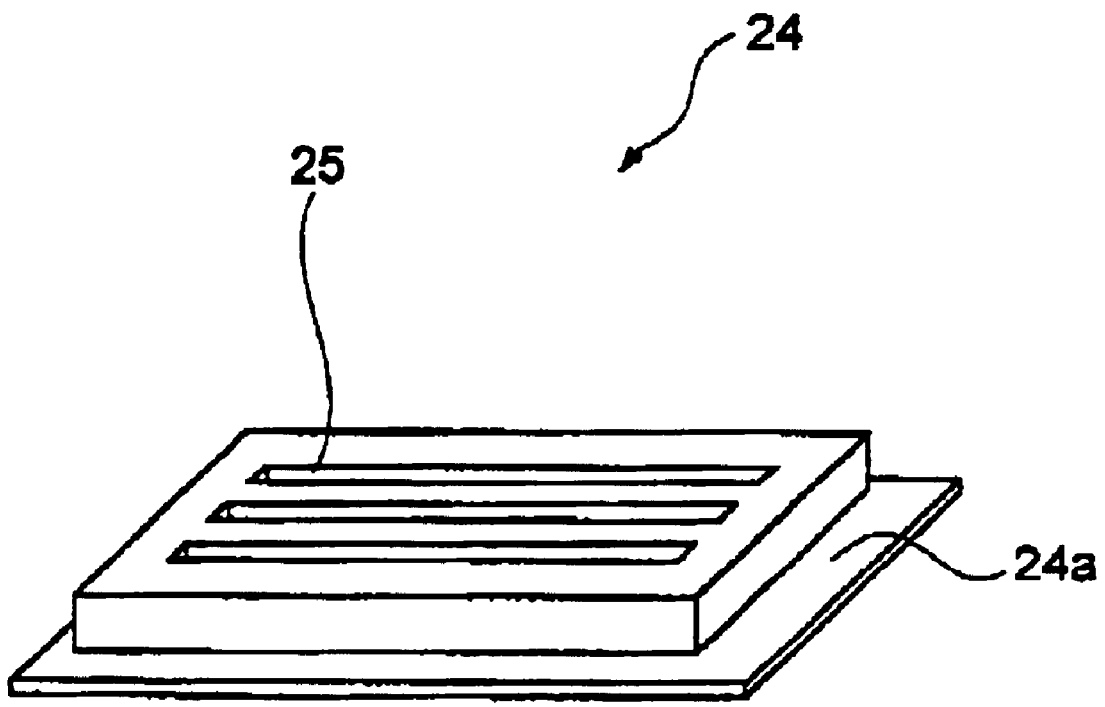
FIG. 5 is a perspective diagram showing the structure of the wick substrate of the cooling device according to the present invention.
Figure 6:
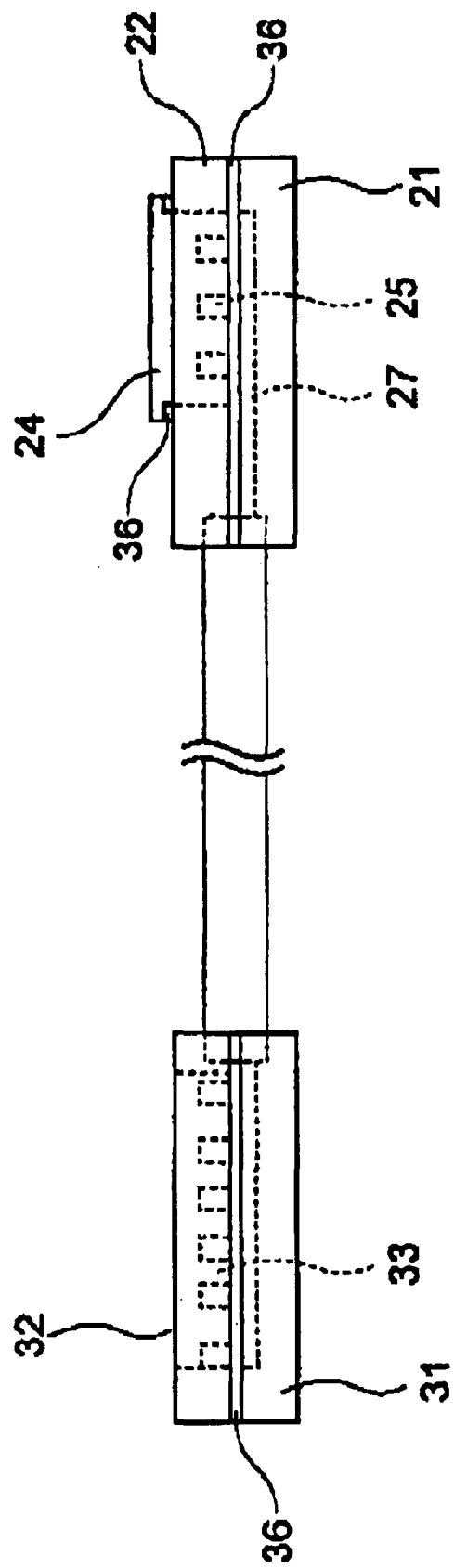
FIG. 6 is a cross sectional view of the cooling device according to the present invention.
Figure 7:
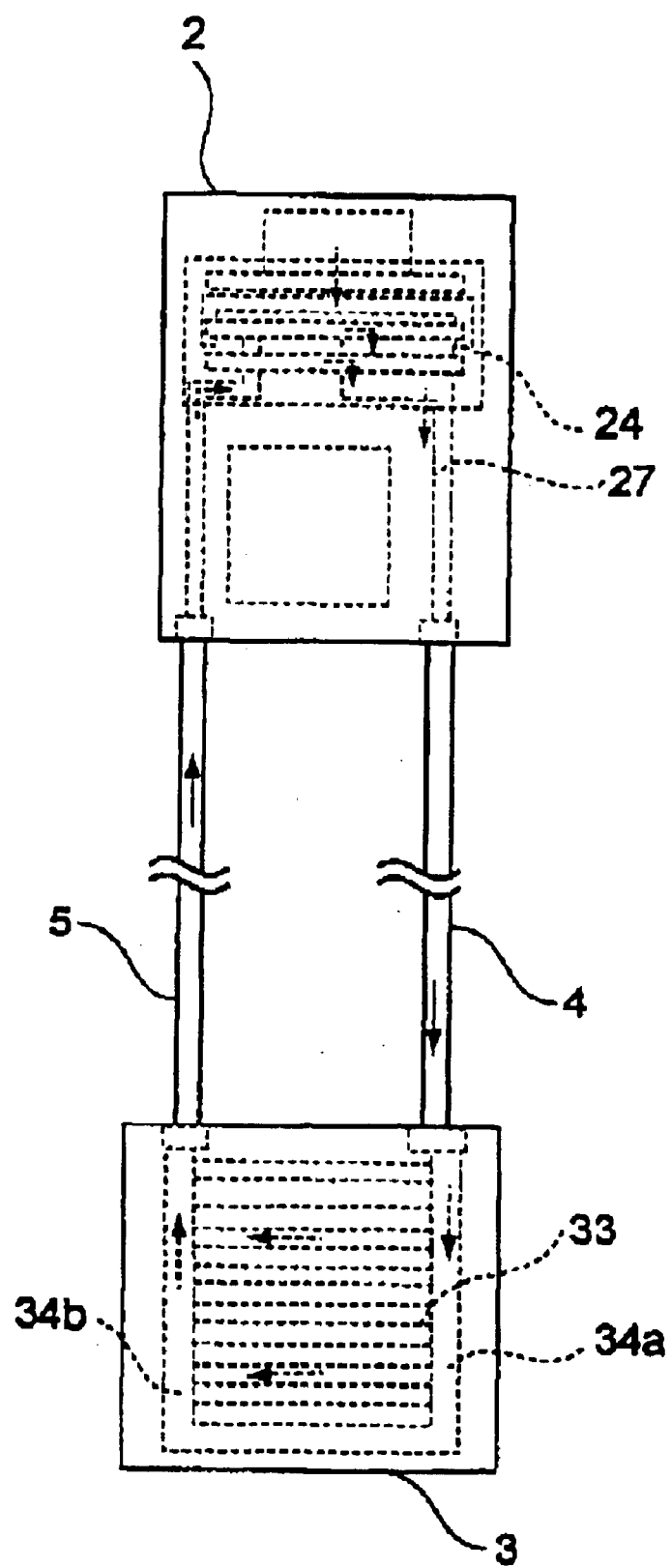
FIG. 7 is a diagram showing the flow of the operating medium in the cooling device according to the present invention.

FIGS. 3, 4 and 5 are diagrams showing respective substrates composing the cooling device 1. FIG. 6 is a diagram showing a cross-section thereof when these substrates are attached. FIG. 7 is a diagram showing an aspect of the interior thereof when these substrates are attached.

As shown in FIG. 2, the evaporator 2 comprises a channel substrate 21 in which the operating medium flows, an opposite substrate 22, and a wick substrate 24 for evaporating the operating medium. The opposite substrate 22 is provided with an opening 23 for mounting the wick substrate 24 therein.

The channel substrate 21 is a rectangular substrate formed of fluorocarbon resins or the like, and includes a reservoir 26, grooves 27, and couplings 28a formed therein. The reservoir 26 is a member for storing a liquid in order to prevent drying out of the heat pipe. The grooves 27 are channels in which the operating medium flows. The couplings 28a are members for mounting the vapor-phase conduit 4 and the liquid-phase conduit 5 thereto.

The opposite substrate 22 is a rectangular substrate formed of fluorocarbon resin or the like, and includes an evaporator opening 23 and couplings 28b formed therein. The evaporator opening 23 is an opening for mounting the evaporator substrate 24 therein. The couplings 28b are provided at positions facing the above-mentioned couplings 28a, and are coupled with the vapor-phase conduit 4 and the liquid-phase conduit 5 using a coupling member such as a swedge lock (not shown).

The wick substrate 24 is formed of a metal having superior thermal conductivity, such as nickel, copper and so on, and copper is employed for the present embodiment. Also, grooves 25 are formed on the surface 24a thereof as wicks.

Oxygen ions are injected onto the surface of the grooves 25 to form films of copper I oxide thereon.

Thus, the hydrophilicity thereof improves by injecting oxygen onto the copper surface to form the copper I oxide surface. More specifically, the contact angle between the copper surface and water is approximately 60 degrees, and when the ion injection is conducted to form the copper I oxide surface thereon, the contact angle between the copper I oxide surface and water is decreased to approximately 15 degree. Thus, the improvement of the hydrophilicity of the groove surfaces 25 leads to increase capillary attraction of the wick, thereby increasing the amount of the operating medium vaporized.

Further, since copper I oxide has higher corrosion resistance to the operating medium, a smaller evaporator with a lower profile can be formed in the present embodiment, while, with the conventional method, a thicker evaporator would be formed, considering the amount of corrosion.

Here, an additional thin film of diamond-like carbon (DLC) may be formed on the copper I oxide groove surfaces to further improve the corrosion resistance.

The condenser 3 is formed of a condenser substrate 31 and an opposite substrate 32. Couplings 35a are provided for mounting the vapor-phase conduit 4 and the liquid-phase conduit 5, as described above for the couplings 24a of the evaporator 2.

The condenser substrate 31 is a rectangular substrate formed of fluorocarbon resins or the like, and includes a vapor-phase channel 34a, through which the vaporized operating medium, which is vaporized in the evaporator 2, flows, grooves 33 for condensing the operating medium, and a liquid-phase channel 34b, through which the condensed operating medium flows to the evaporator 2. Also, couplings 35a couples the vapor-phase conduit 4 and the liquid-phase conduit 5 to the condenser 3.

The opposite substrate 32 is a rectangular substrate formed of fluorocarbon resins or the like, and is capable of being joined with the condenser substrate 31 to function as a condenser.

The vapor-phase conduit 4 and the liquid-phase conduit 5 are tubular-shaped are formed of fluorocarbon resin. The liquid-phase conduit 5 is a conduit through which the liquid operating medium condensed in the condenser 3 is transported to the evaporator 2. The vapor phase conduit 4 is a conduit through which the gas vaporized in the evaporator 3 is transported to the condenser 2.

The evaporator 2 is formed by joining the channel substrate 21 and the opposite substrate 22, and by installing the wick substrate 24 into the opening 23 formed on the opposite substrate 22. The condenser is prepared by joining the groove substrate 31 and the opposite substrate 32. Either one of the thus-formed evaporator 2 and condenser 3 is filled with an operating medium of, for example, water, and then the above-mentioned vapor-phase conduit 4 and the liquid-phase conduit 5 are installed into the couplings 28 and couplings 35 to form the cooling device 1. Adhesive such as polyimide resin 36, is used for the installation and joining.

Since the evaporator 2 and the condenser 3 are coupled by the flexible vapor-phase conduit 4 and liquid-phase conduit 5, flexible arrangement that can be adapted to various arrangements of objects to be cooled is provided, thereby efficiently cooling the objects.

Next, the cooling operation of the thus constructed cooling device will be described with reference to FIG. 7, starting from the description of the liquid-phase conduit 5 for the sake of convenience.

The operating medium transported by the liquid-phase conduit 5 is vaporized on the wick substrate 24 with the heat that is absorbed from the object by the evaporator 2. The vaporized operating medium flows through the vapor-phase conduit 4 into the vapor-phase channel 34a, and releases the heat while passing through the grooves 33, thereby condensed again. The liquid then passes through the liquid-phase channel 34b and through the liquid-phase conduit 5, to flow into the evaporator 2. Then, the operating medium is again vaporized by the heat absorbed from the object by the evaporator, and flows into the condenser 3 again. The circulation of the liquid and the vapor provides cooling by transferring the heat from the evaporator 2 to the condenser 3.

Here, although the above-mentioned embodiment employs tubes of fluorocarbon resin for the vapor-phase conduit and the liquid-phase conduit, other materials such as silicone rubber, polyurethane, or polypropylene may be used for the material of the vapor-phase conduit and the liquid-phase conduit.

According to tube leakage tests conducted by the present inventors, there were no problem regarding the air-tightness of the tubes when silicone rubber, polyurethane, or polypropylene were used for the material of the vapor-phase conduit and the liquid-phase conduit. That was confirmed in the tube leakage tests.

A tube testing apparatus for conducting the tube leakage tests may be, for example, an apparatus that is capable of coupling the respective testing tubes to a vacuum chamber thereof by a feedthrough, and of conducting the measurement of the leakage thereof by charging air or helium into the tubes.

The results of the tube leakage tests showed that polyurethane and polypropylene, as well as fluorocarbon resins, produced results below the detection limit. Even though the polyurethane is unstable at elevated temperatures, is used, polyurethane can be adequately applied to tubes of apparatuses operating at lower temperatures (lower heat transfer).

Also, it was found that the leakage of the silicone tube was within a range suitable for the practical use, depending upon the design for the required heat transfer capacity.

When silicone, polyurethane, or polypropylene is used for the material of the tubes, joints can be easily formed, since suitable adhesive can be used for these resins, unlikely to use fluorocarbon resin.

Production Method for The Cooling Device

Next, the production method for the cooling device according to the present invention will be described by referring to FIGS. 8 to 14.

Figure 8:
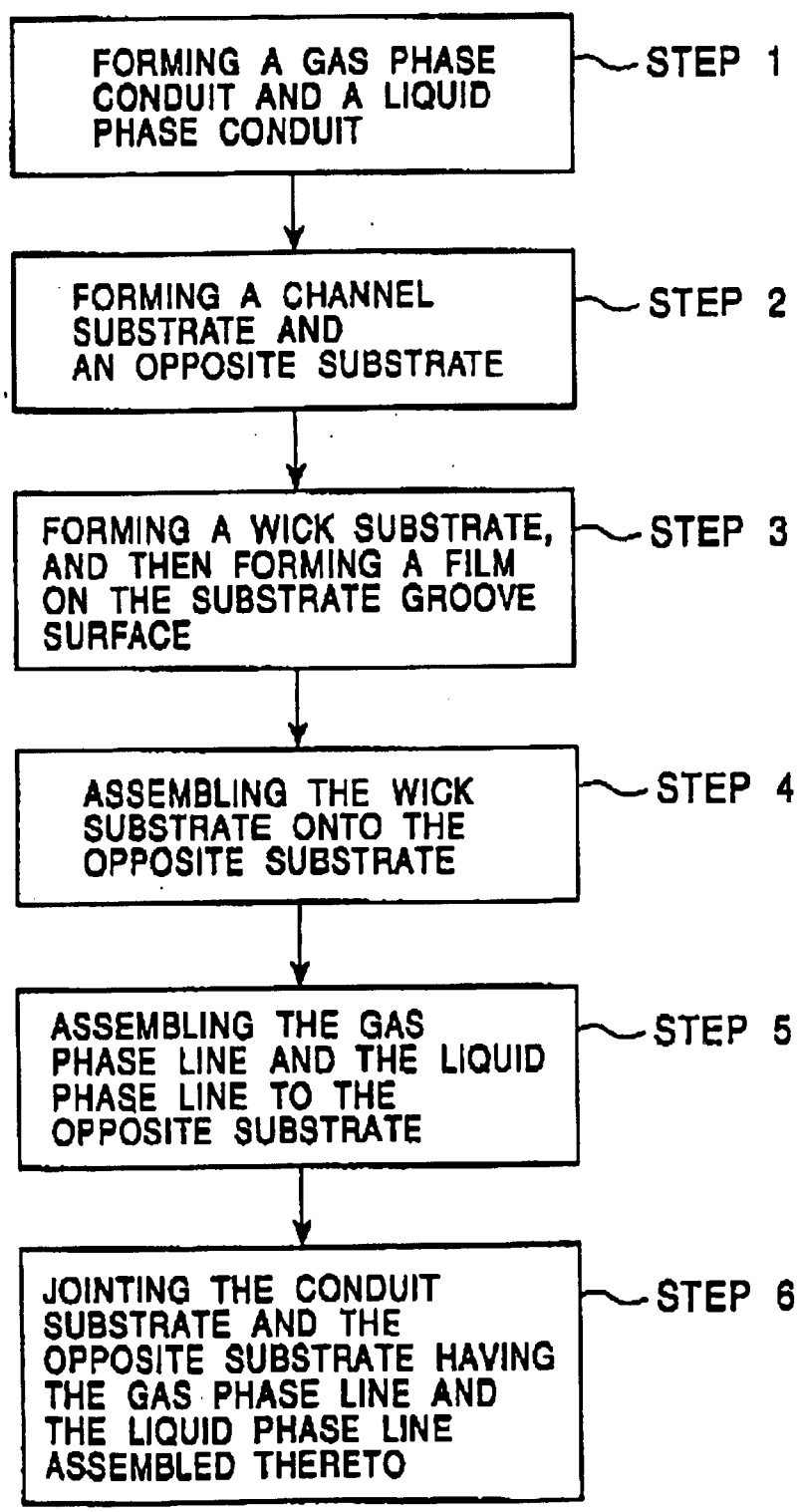
FIG. 8 is a flow chart showing the production method for the cooling device according to the present invention.

FIG. 8 shows the production steps for producing the cooling device 1.

First, when the cooling device is to be installed in, for example, a notebook personal computer, the vapor-phase conduit 4 and the liquid-phase conduit 5 may be designed taking into account the dimensions of the installed condenser 3, the dimensions of the evaporator 2 depending on the CPU, and the distance between the evaporator 2 and the condenser 3 (step 1). These may be prepared by using, for example, a mold.

Next, the opposite substrates 22 and 23 and grooves of the channel substrates 21 and 31 of the evaporator 2 and the condenser 3, respectively, are formed for functioning as heat pipe (step 2). For example, the grooves 27 are formed on the surface of the channel substrate 21 formed of fluorocarbon resin, and the grooves 33 and the vapor-phase conduit 34a, and the vapor-phase conduit 34b are formed on the surface of the channel substrate 31 formed of fluorocarbon resin. The evaporator openings 25 are formed on the surface of the opposite substrate 22 that is formed of fluorocarbon resin, and the opposite substrate 19 is formed to have a predetermined shape. In this case, the evaporator 2 preferably has dimensions that are substantially the same as the area of the object to be cooled, e.g., the area of the CPU. Having such dimensions provides efficient cooling by one evaporator, even if a device having a larger heat capacity is used.

The channel substrates 21 and 31 and the opposite substrate 22 and 32 are formed by, for example, the TIEGA (Teflon Included Etching Galvanicforming) method. The TIEGA method will be specifically described on the basis of the disclosures of FIGS. 9A to 9E.

Figure 9A:
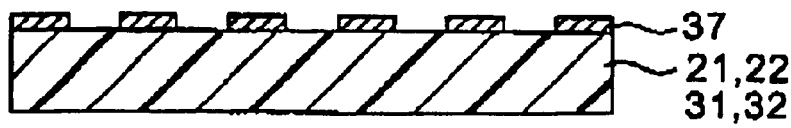
FIG. 9A to FIG. 9E are diagrams illustrating the processes for forming the substrate of the cooling device according to the present invention.

As seen in FIG. 9A, a patterned metal mask 37 is disposed on the channel substrates 21 and 31 and the opposite substrates 22 and 32.

Figure 9B:
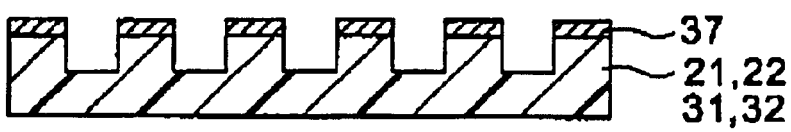

Next, as seen in FIG. 9B, fluorocarbon resin thereon is processed by synchrotron radiation to form grooves or openings on the channel substrates 21 and 31 and the opposite substrates 22 and 32. Here, the synchrotron radiation is electromagnetic waves generated by accelerating electrons or positrons to nearly the speed of light and by bending the traveling direction thereof in a magnetic field.

Figure 9C:

Then, as seen in FIG. 9C, the metal mask 37 is removed to complete the forming of the groves or openings of the channel substrates 21 and 31 and the opposite substrates 22 and 32.

Figure 9D:
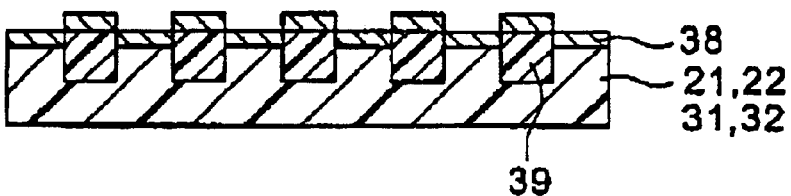

Next, as seen in FIG. 9D, an adhesive layer that is necessary for thermal pressurization is formed. A resist layer 39 is formed in the groves or openings of the channel substrates 21 and 31 and the opposite substrates 22 and 32. Further, an injection layer is formed on the fluorocarbon resin surface by the FDVA (Filtered Cathodic Vacuum Arc) method. Although a copper layer 38 is employed for the injection layer, silicone may also be used.

Figure 9E:
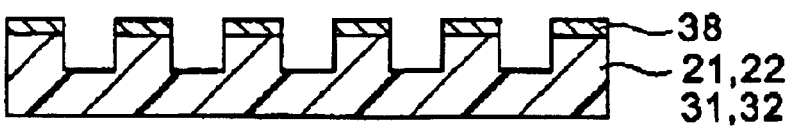

Next, as seen in FIG. 9E, the resist layer 39 is stripped to form the adhesive layer, thereby completing the formation of the channel substrates 21 and 31 and the opposite substrates 22 and 32.

Although the channel substrates 21 and 31 and the opposite substrates 22 and 32 are formed by the synchrotron radiation, these substrates may also be formed by other available methods including irradiating with a laser beam such as an excimer laser and so on, molding with a metal mold, and reactive ion etching. Further, the copper layer 38 may be formed by depositions or sputtering after modifying the surface properties of the fluorocarbon resin with the excimer laser. This method achieves efficient substrate formation.

Next, the wick substrate 24 is formed (step 3). The evaporator substrate 24 having grooves thereon is then formed by, for example, a method called UV-LIGA. The details of UV-LIGA will be described as follows, on the basis of the disclosure of FIGS. 10A to 10D.

Figure 10A:
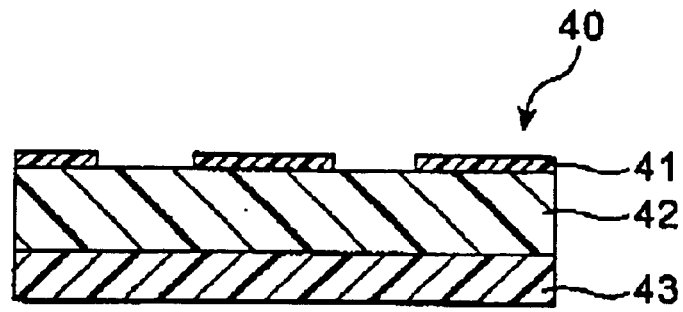
FIG. 10A to FIG. 10D are diagrams illustrating the processing steps for forming the substrate of the cooling device according to the present invention.

As seen in FIG. 10A, a resist layer 42 of, for example, SU-8, an organic material, is formed on a plate 43, and a patterned resist film 41 is formed thereon. Here, the substrate is referred as a patterned substrate 40.

Figure 10B:
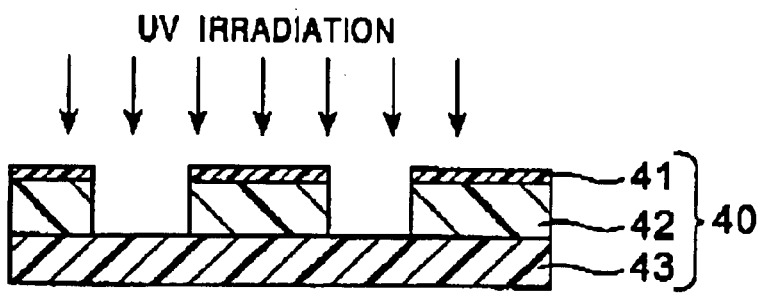

Next, as seen in FIG. 10B, the patterned substrate 40 is irradiated by UV light from above to perform etching the resist layer 42.

Figure 10C:
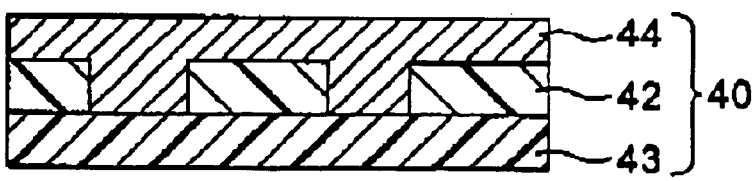

Then, as seen in FIG. 10C, the resist film 41 is stripped from the patterned substrate 40, and then a copper layer 44 is formed on the stripped surface.

Figure 10D:
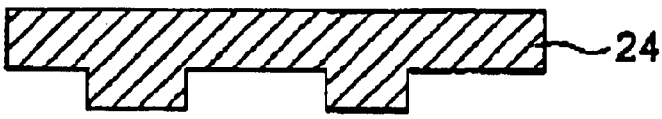

Then, as seen in FIG. 10D, the copper layer 44 is stripped from the patterned substrate 40. The stripped copper layer 44 is used as the wick substrate 24 having grooves.

Next, oxygen ions are implanted into the copper groove surface of the thus-obtained wick substrate 24 by a plasma-based ion implantation (abbreviated as PBII) technique to form a copper I oxide ($Cu_2O$) layer.

Figure 11:
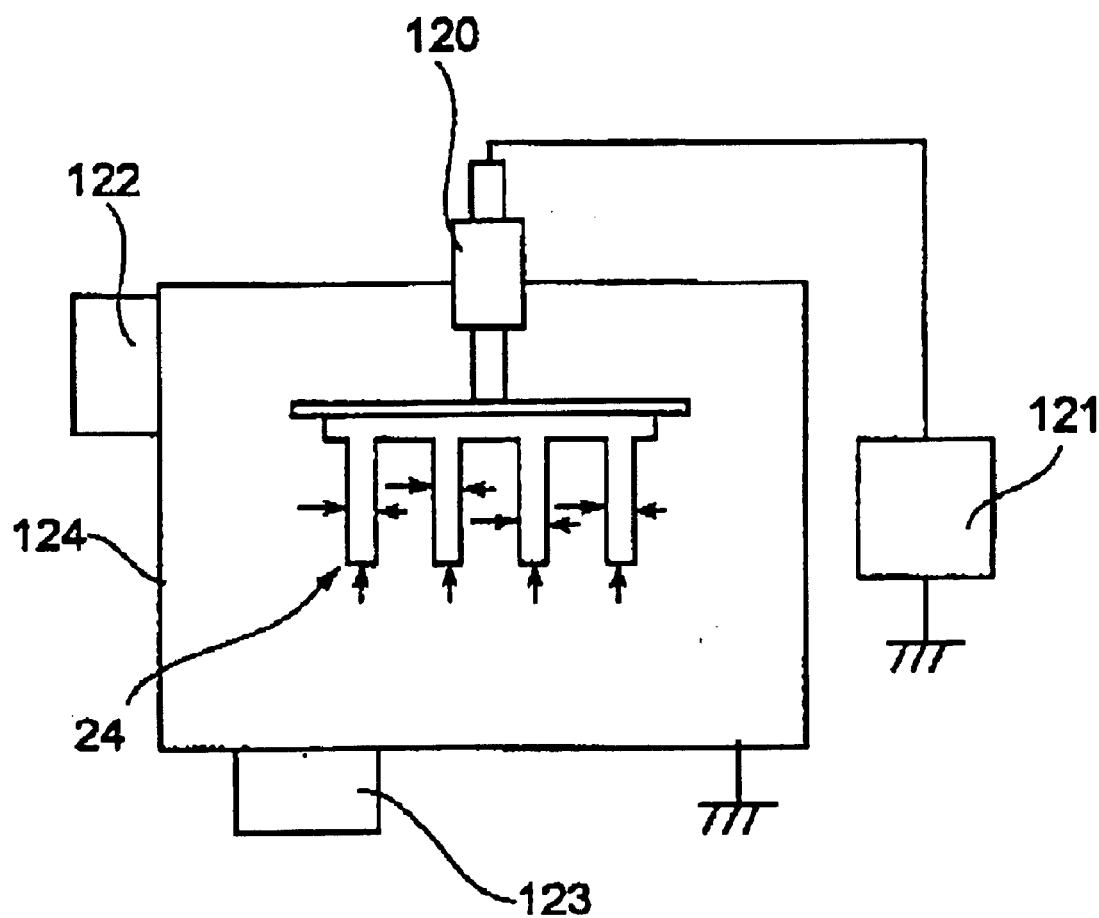
FIG. 11 is a schematic diagram showing the film treatment processing steps for the wick substrate according to the present invention.
Figure 12A:
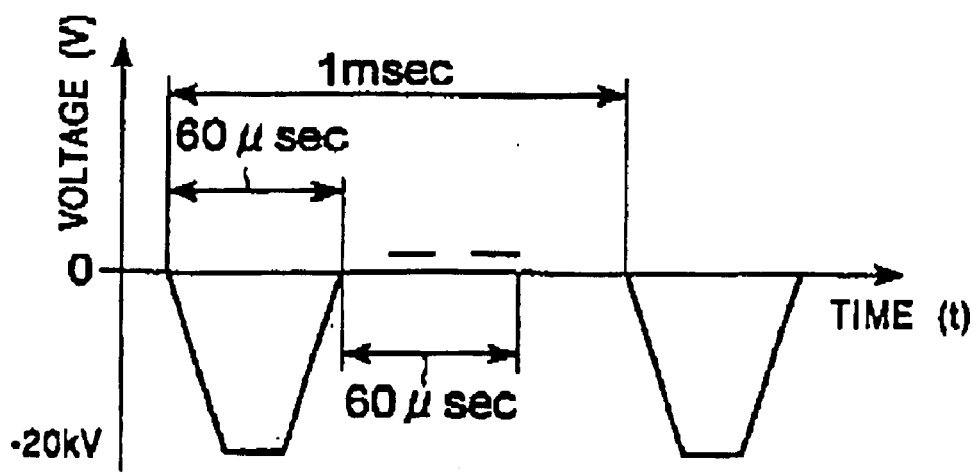
FIG. 12A and FIG. 12B are graphs showing the film treatment conditions for the wick substrate according to the present invention.
Figure 12B:
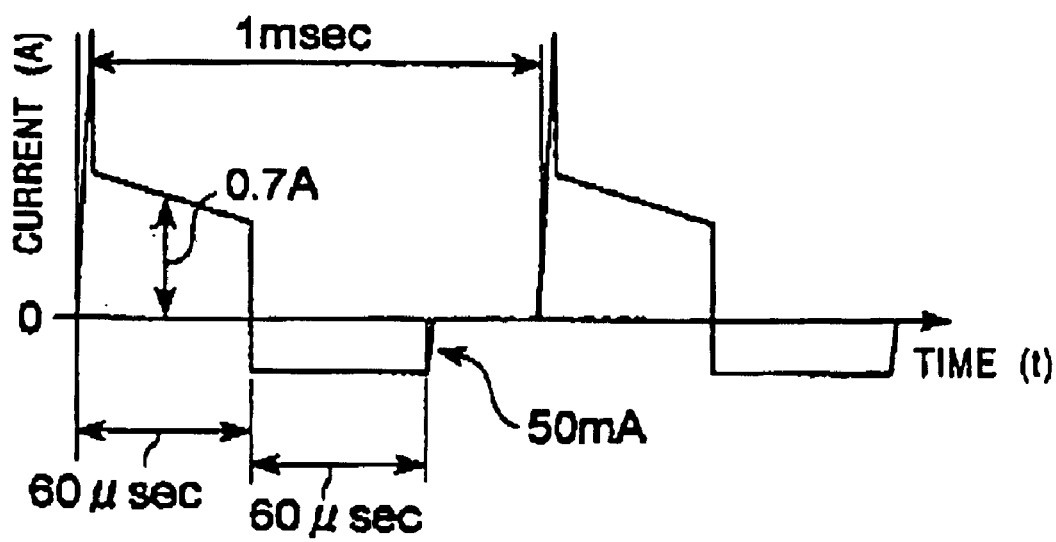

FIG. 11 shows a surface processing apparatus that utilizes the PBII (plasma-based ion implantation) technique for the grooves 25 of the wick substrate 24. FIGS. 12A and 12B are graphs showing the pulse voltages in the processing by using the apparatus shown in FIG. 11.

As shown in FIG. 11, the wick substrate 24 is disposed in the central portion of a vacuum apparatus 124, and is coupled to a pulse voltage source 121 by an insulating mustard seed 120. The vacuum apparatus 124 can be evacuated by a vacuum pump 123, and various ions such as oxygen, nitrogen, titanium and the like are supplied depending on the application, from an ion source 122 in synchronization with the pulse. The apparatus of this embodiment is supplied with oxygen ions.

The PBII technique modifies the function of the three-dimensional surfaces of the grooves 25 by applying a negative pulse of high voltage to the surfaces of the grooves 25 that are disposed in the central portion within the vacuum apparatus 124, while the surface of the groves are treated by plasma ions.

Oxygen ions supplied from the ion source 122 are pulse-ionized under the conditions shown in FIGS. 12A and 12B for implanting them into the grooves 25, which are composed of oxygen-free high conductivity copper. For example, oxygen ions are implanted into grooves, which have a depth of 20 $\mu$m, a spacing of 100 $\mu$m and a width of 40 $\mu$m under the following conditions: an implantation time of about 1 minute, a temperature of 35° C., and a pulse electric current of 0.7 A, thereby conducting the ion implantation into the surface of the grooves 25. The surfaces of the grooves 25 were modified from oxygen-free copper to copper(I) oxide by this implantation process. The contact angle of the surface of the unprocessed oxygen-free copper was measured by using water drop and the angle thereof was 60 degrees, and the contact angle for the modified surface by implanting the oxygen ions was 15 degrees: that is, it was confirmed that the hydrophilicity improved. Thus, the modification improved the capillary attraction of the wick to achieve a larger pumping attraction.

Here, the evaporator substrate 24 may also be formed by reactive ion etching.

Then, the thus-formed evaporator substrate 24 is installed into the evaporator opening 23 that is formed through the opposite substrate 22, and is joined by means of adhesive or the like (step 4).

Figure 13:
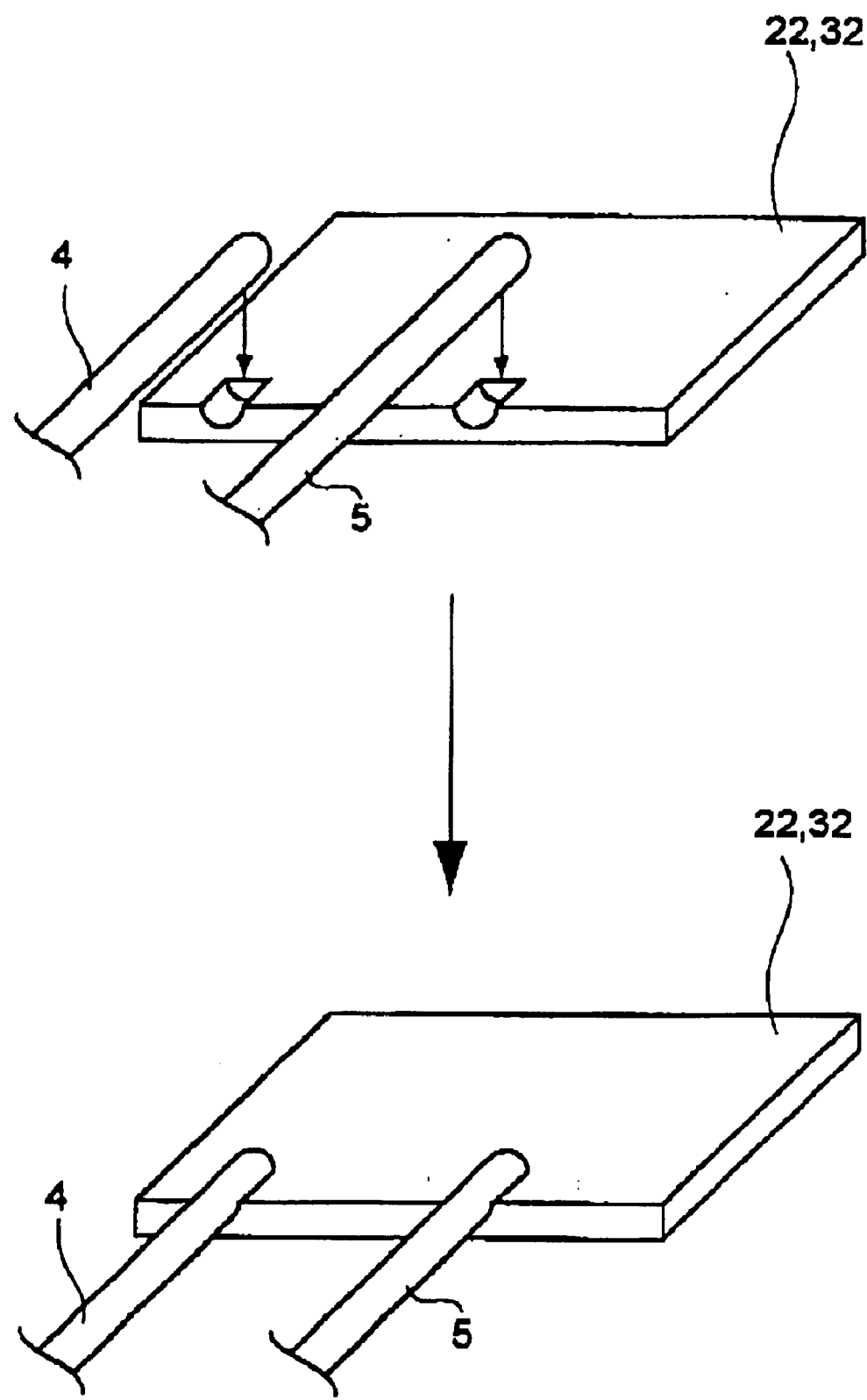
FIG. 13 is a schematic diagram showing the processing step for assembling the vapor-phase conduit and the liquid-phase conduit to the cooling device according to the present invention.

As also shown in FIG. 13, the opposite substrates 22 and 32 are coupled with the vapor-phase conduit 4 and liquid-phase conduit 5 by the couplings 28b and 35b (step 5).

Figure 14:
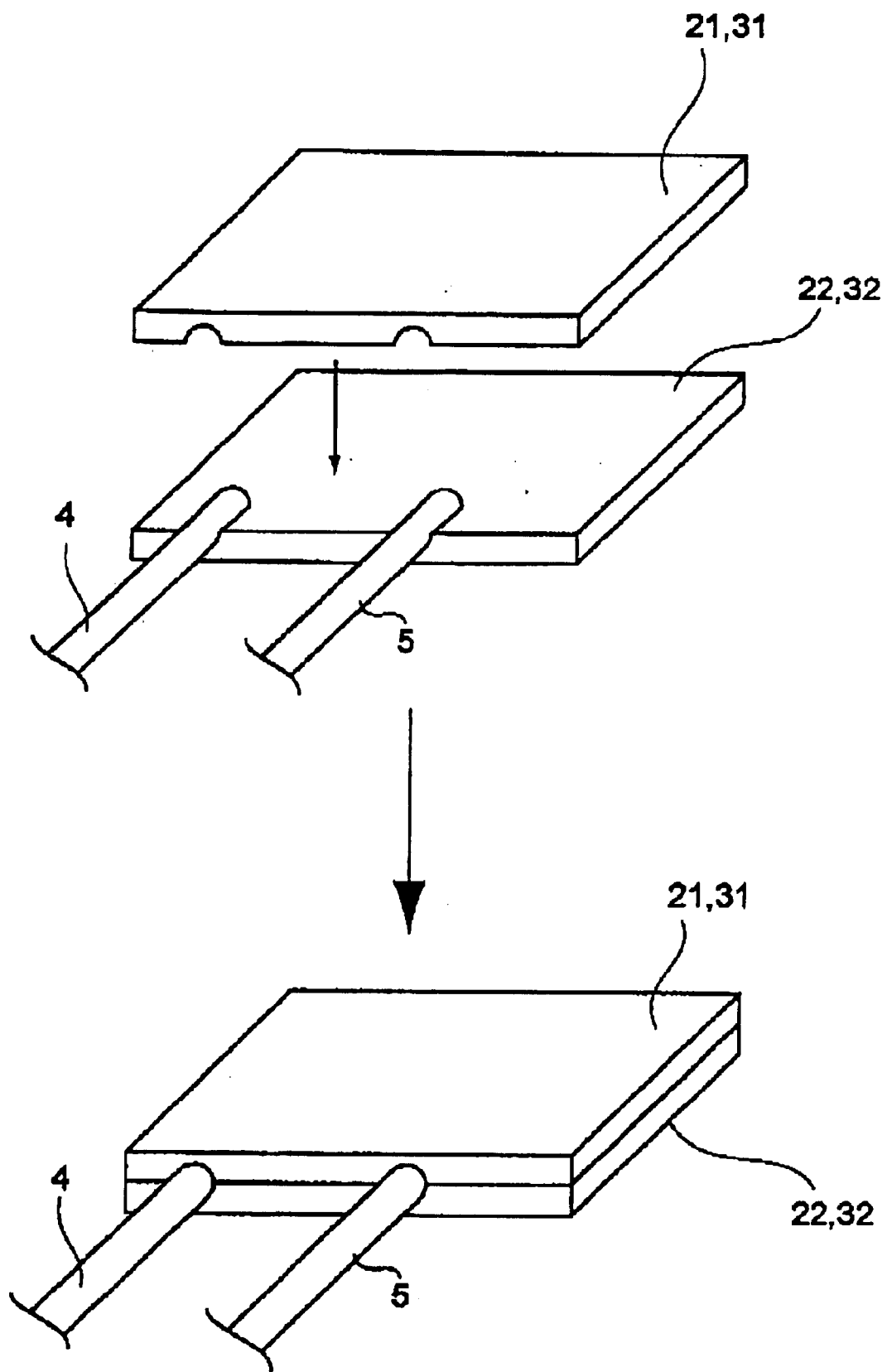
FIG. 14 is a schematic diagram showing the processing step of jointing the channel substrate and the opposite substrate for the use in the cooling device according to the present invention.

Then, as shown in FIG. 14, the channel substrates 21 and 31 are bonded to the opposite substrates 22 and 32, which incorporate the evaporator 2, condenser 3, the vapor-phase conduit 4, and the liquid-phase conduit 5 (step 6).

In the processing steps of steps 4 to 6, the substrates are pressed and heated to be bonded together by the polyimide layer 36 acting as the adhesive layer, therebetween, under vacuum condition (about 2660 Pa) and a temperature of about 350° C., in order to eliminate a gap between the substrates or between the substrate and the vapor phase line 12 or the liquid phase line 13.

As described above, the cooling device 1 can be produced according to the above method with higher accuracy and reliability.

Here, although the substrates are formed of fluorocarbon resin in this embodiment, other materials such as other resins or polyimide, dimethyl siloxane and so on, and glasses may be used for the substrates.

Electronic Apparatuses

Figure 15:
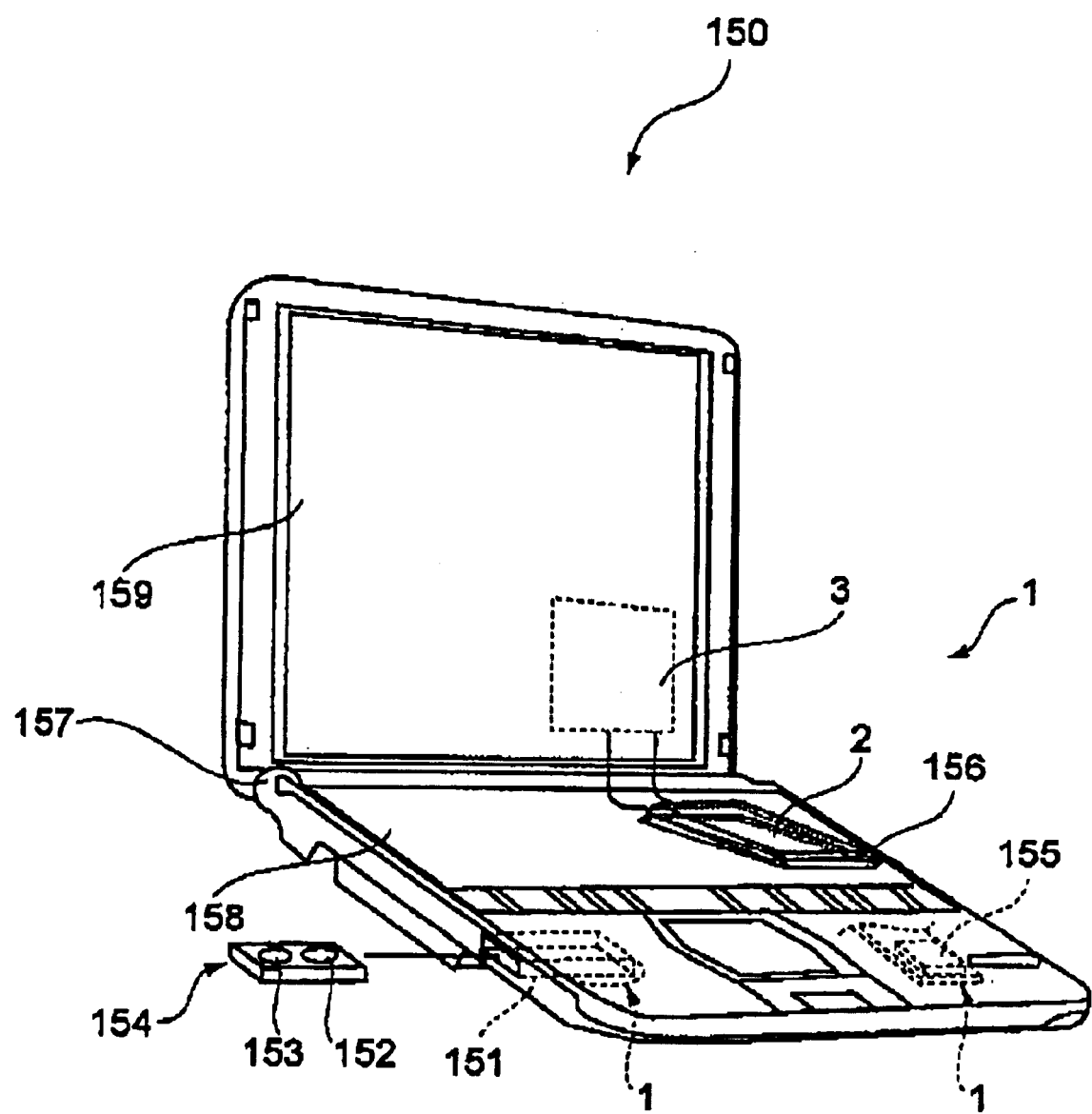
FIG. 15 is a schematic perspective diagram showing the electronic apparatus having the cooling device according to the present invention incorporated therein.

FIG. 15 is a schematic perspective view of a notebook personal computer 150 including a cooling device according to the present invention.

The personal computer 150 comprises: an operating unit 158 including a slot 151 for inserting in and removing from the computer a recording medium 154 having a flash memory 153 and a driver 152 and a central processing unit (CPU) 156; a displaying surface 159a for displaying an image; and a displaying unit 159 including a circuit surface 159b (not shown) in which circuits for processing signals are formed, and these units and surfaces are coupled by a coupling 157 to form the notebook personal computer.

Here, a cooling device 1 according to the present invention is disposed adjacent to the central processing unit 156 so that an evaporator 2 having substantially the same area as the area of the central processing unit is disposed adjacent to the central processing unit. Also, a condenser 3 is provided on the backside of the display unit 159, and pipes 4 and 5 through which vapor/liquid operating medium flows are coupled between the evaporator 2 and the condenser 3 by the coupling 157 to form heat pipe.

Thus, the cooling device 1 is adaptable for accommodating the arrangement of the evaporator 2 and the condenser 3 according to the configuration of the built-in device, and therefore its size and profile can be reduced and the efficient cooling can be achieved. The cooling device 1 may also be disposed in the personal computer 150 so that the evaporator 2 is located beneath, for example, the driver 152 of the recording medium 154 that is mounted by a display slot of the above-mentioned displaying unit 159.

Acoustic Apparatuses

Figure 16:
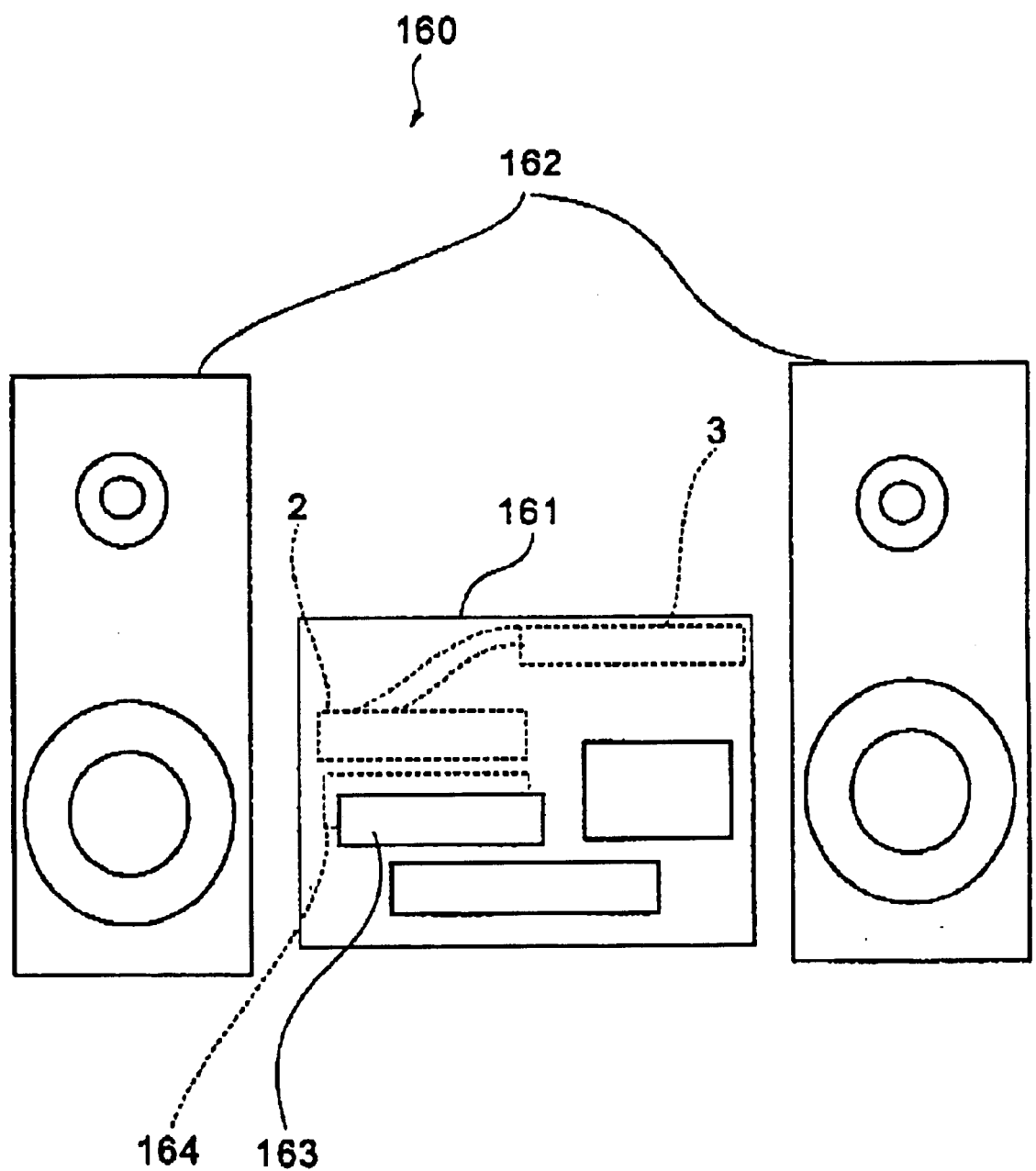
FIG. 16 is a schematic perspective diagram showing the acoustic apparatus having the cooling device according to the present invention incorporated therein.

FIG. 16 is a schematic unit diagram of an audio set including a cooling device according to the present invention.

The audio set 160 comprises a main unit 161 for playing back recording media on which music is recorded and controlling the sound volume and sound quality, and a pair of speakers 162 that couple to the main unit 161 to output sound. The main unit 161 includes an amplifier 163 for controlling the sound volume and the sound quality, in which a power transistor 164 is installed.

Here, the evaporator 2 of the cooling device 1 is disposed so as to be close to the power transistor 164, and is coupled to the condenser 3, which is disposed in a predetermined position, by the pipes 4 and 5. Since the pipes 4 and 5 are flexible and capable of bending, the condenser 3 can be suitably disposed in a small space, thereby efficiently releasing heat generated by the power transistor. In the main unit 161 of the audio set 160, the evaporator 2 can efficiently cool the power transistor 164, and the heat obtained therefrom can also be efficiently released from the condenser 3.

Other Embodiment of the Cooling Device

Figure 17:
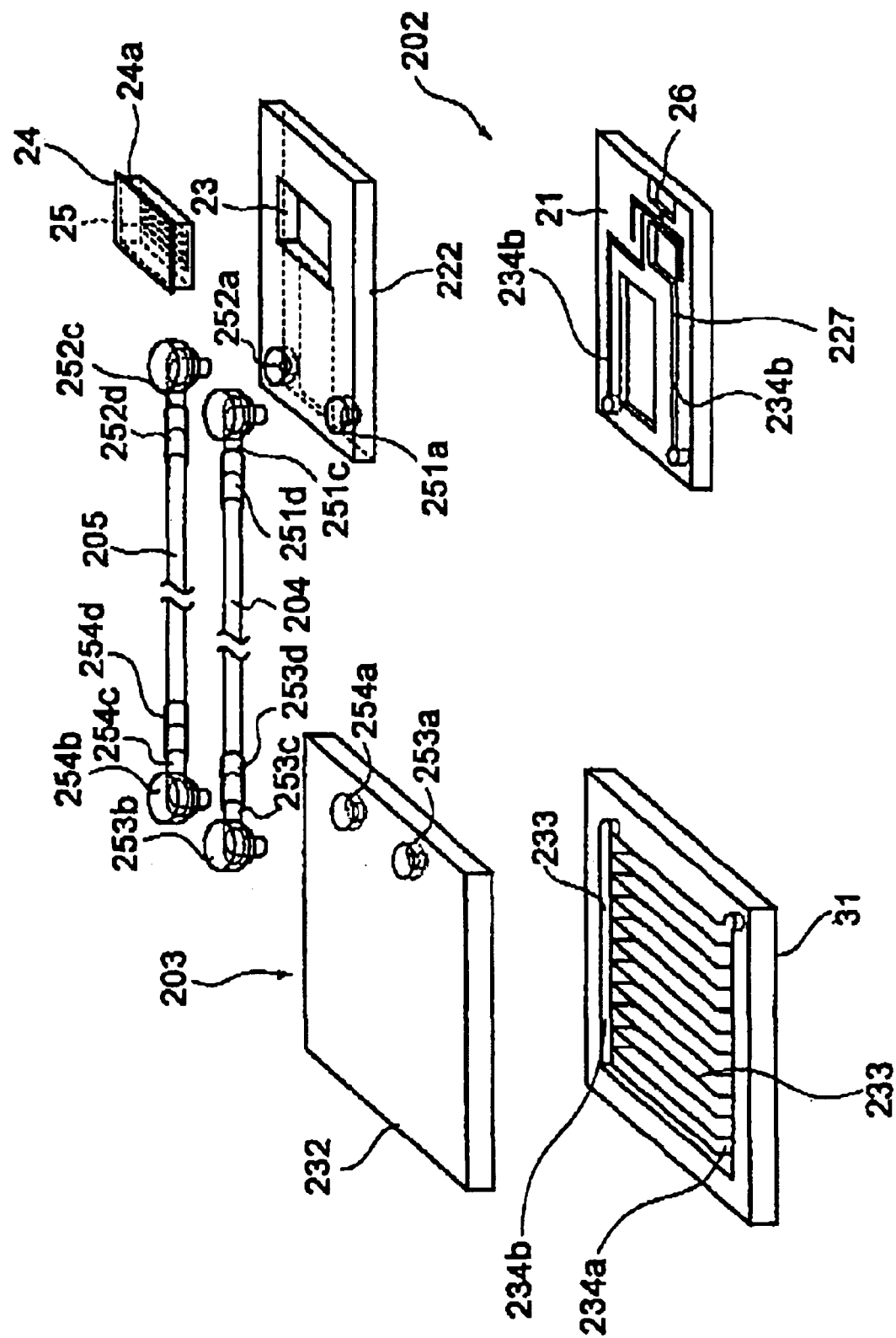
FIG. 17 is an exploded perspective diagram showing the cooling device of another configuration according to the present invention.
Figure 18:
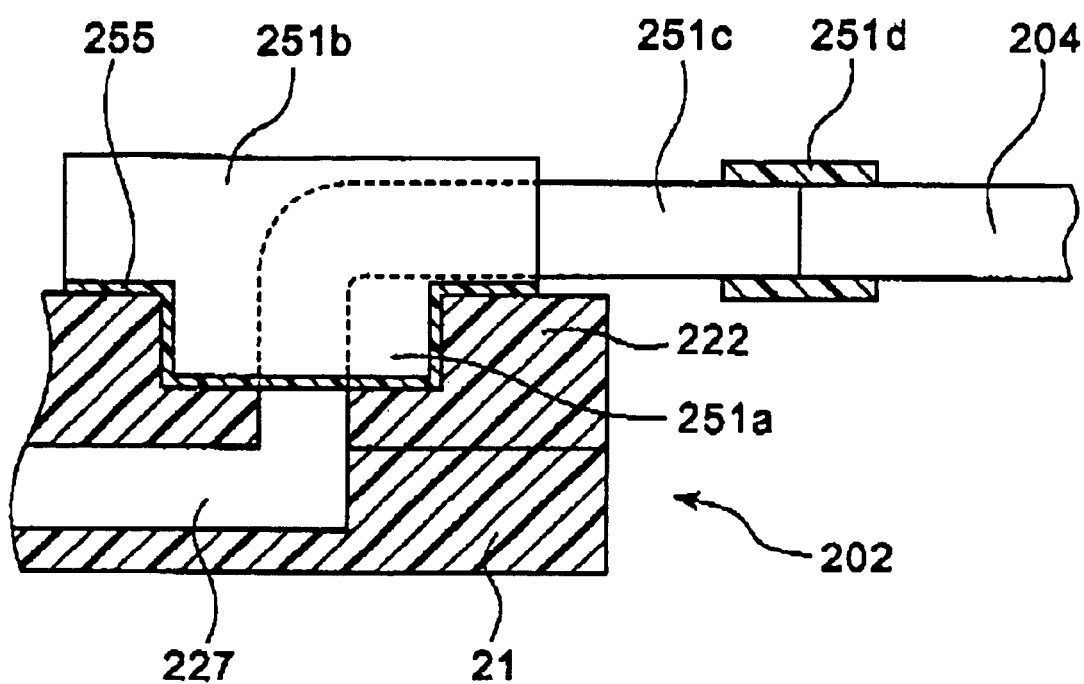
FIG. 18 is a partial cross-sectional view of the cooling device shown in FIG. 17.

FIG. 17 is an exploded perspective view of a cooling device according to another embodiment of the present invention. FIG. 18 is a partial cross-sectional view of the cooling device. In these figures, identical reference numerals as used in FIGS. 1–7 are assigned to identical components.

As shown in these figures, an opposite substrate 222 of an evaporator 202 comprises an opening 251a, which leads to a groove 227 of a vapor-phase channel 234a and an opening 252a, which leads to a groove 227 of a vapor-phase channel 234b. Similarly, an opposite substrate 232 of a condenser 203 comprises an opening 253a, which leads to a groove 233 of a vapor-phase channel 234a and an opening 254a, which leads to a groove 233 of a liquid-phase channel 234b.

The openings 251a–254a are coupled to tube fittings 251b–254b, respectively, which are made of, for example SUS or Cu, by an epoxy resin layer 255. A coupling 251c (a portion of a protruded edge of the tube) of the tube fitting 251b is coupled to a coupling 253c of the tube fitting 253b by a tube 204 made of fluorocarbon resin. Also, a coupling 252c of the tube fitting 252b is coupled to a coupling 254c of the tube fitting 254b by a tube 205 made of fluorocarbon resin.

The joint between the coupling 251c and the tube 204 is cladded with a tube 251d made of a self-bonding fluorocarbon resin. Similarly, the joint between the coupling 253c and the tube 204 is cladded with a tube 253d made of a self-bonding fluorocarbon resin, the joint between the coupling 252c and the tube 205 is cladded with a tube 252d made of a self-bonding fluorocarbon resin, and the joint between the coupling 254c and the tube 205 is cladded with a tube 254d made of a self-bonding fluorocarbon resin. These tubes 251d–254d may be covered by disposing another tube having larger diameter than, for example tubes 204 and 205, at the joints, and then heating the tubes.

Accordingly, the air-tightness of the joints between the couplings 251c–254c and the tubes 204 and 205 can be improved by cladding the couplings 251c–254c and the tubes 204 and 205 with the tubes 251d–254d made of a self-bonding fluorocarbon resin. In particular, using the tubes 251d–254d made of a self-bonding fluorocarbon resin with the tubes 204 and 205 causes a polymerization reaction therebetween, thereby providing considerably high air-tightness.

Other Examples of Tube

Figure 19:
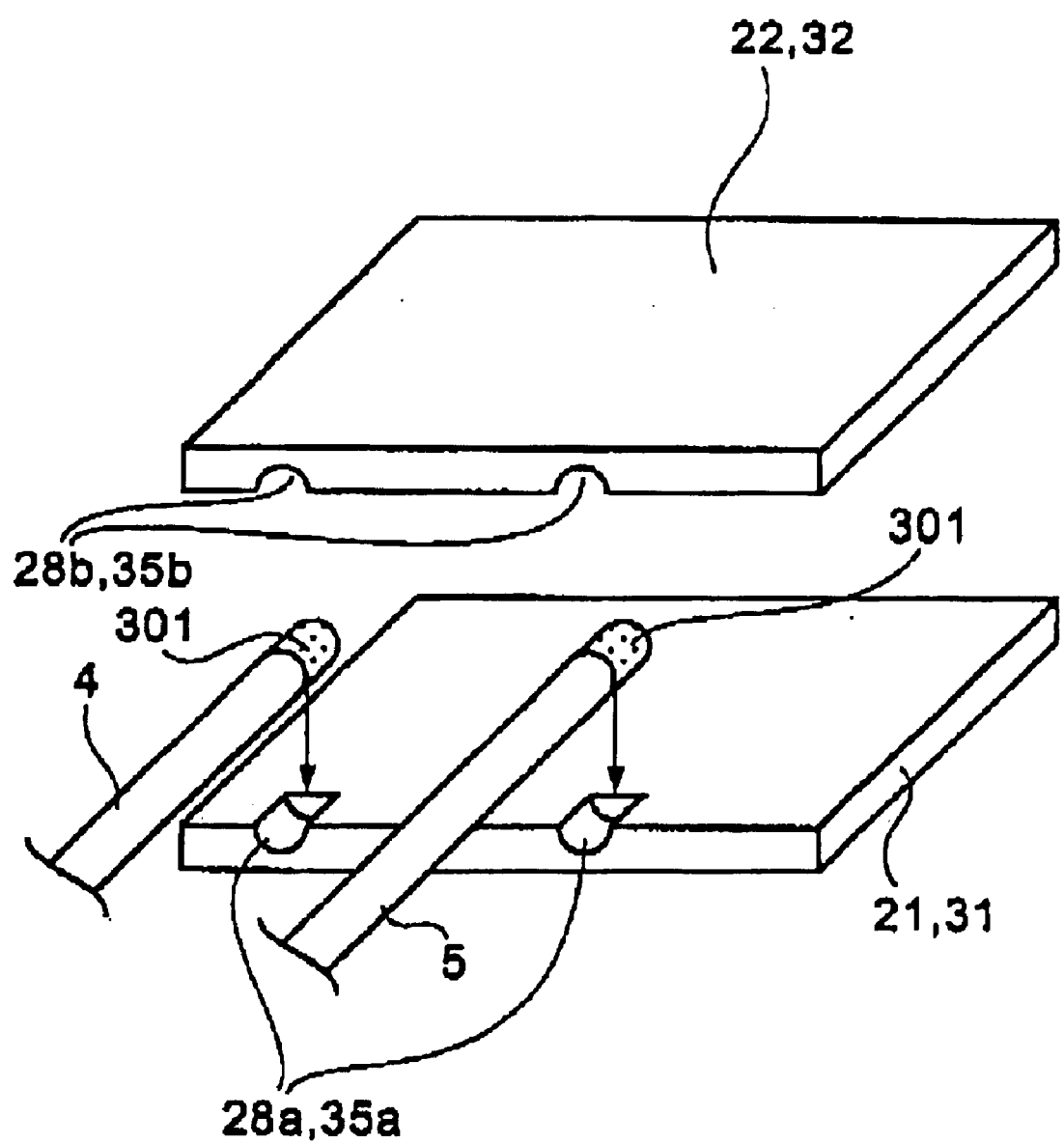
FIG. 19 is a partial exploded perspective diagram showing the structure of the cooling device of yet another configuration according to the present invention.

FIG. 19 is a partial exploded perspective view showing the configuration of a cooling device according to yet another embodiment of the present invention.

The configuration of the cooling device of this embodiment is almost the same as that of the cooling device shown in FIGS. 1 to 7, except that contacts 301 between the fluorocarbon resin tubes 4 and 5 and at least couplings 28a, 28b, 35a and 35b are treated with hydrogen plasma.

The treatment with hydrogen plasma is a plasma treatment or reactive ion etching treatment with hydrogen plasma, hydrogen ion or gas sources containing hydrogen. An example of the treatment may be the processing in which hydrogen is used for the source gas in a general plasma generator and the generated plasma is irradiated onto the surfaces of the tubes 4 and 5 to directly excite and eliminate fluorine atoms and terminated with hydrogen.

The plasma is preferably generated under the following conditions: RF frequency: 13.56 MHz; RF power: 100 W; type of gas and flow rate: $H_2$, 1–20 sccm, preferably 3–10 sccm; and degree of vacuum: $1\times10^{-4}$ to $1\times10^{-1}$ Pa, preferably $1\times10^{-3}$ to $1\times10^{-2}$ Pa.

Here, the gases other than $H_2$ of the present embodiment may include $H_2$, $CHF_3$, $SiH_2$ and so on.

Figure 20:
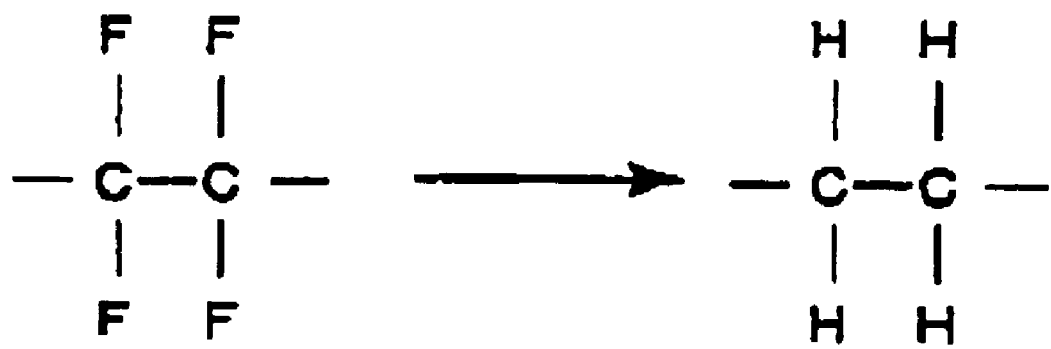
FIG. 20 is a diagram showing the principle of substituting fluorine atoms with hydrogen atoms in fluorocarbon resin molecules.

The reason for the absence of adhesiveness of fluorocarbon resins such as TEFLON® is due to fluorine atoms terminating the carbon atoms of the molecular chain, as shown in FIG. 20. In this embodiment, fluorine atoms are substituted with hydrogen atoms for the purpose of improving adhesiveness thereof. This reaction is useful for jointing the tubes 4 and 5 made of fluorocarbon resin to the couplings 28a, 28b, 35a and 35b, without employing a mechanical structure such as a tube fitting for jointing, as shown in FIG. 17.

The treatment with hydrogen plasma according to the present invention has the advantages of lower cost, higher productivity, and less toxic waste, compared with another technique of substituting fluorine atoms with hydrogen atoms by reacting the fluorocarbon resin with alkali metal ions (generally, Na) by means of wet etching or the like. Here, the treatment with hydrogen plasma can be applied to a whole range of products made of fluorocarbon resins as well as tubes.

Figure 21:
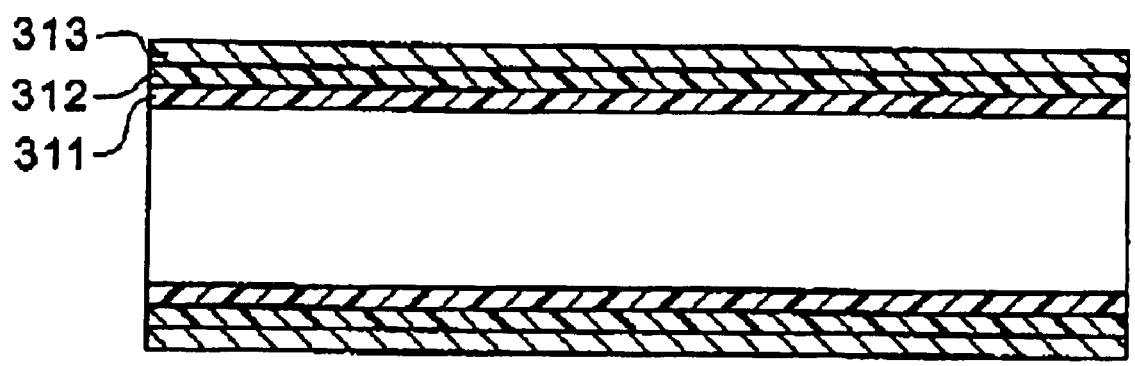
FIG. 21 is a cross-sectional view showing the structure of the tube of the cooling device of yet another configuration according to the present invention.

As shown in FIG. 21, a surface of the tube body 311 made of a fluorocarbon resin may be treated with the above-mentioned hydrogen plasma to form a plasma-treated surface 312, and in turn, a metal thin film comprising Cu, Al, Ni, Ti, Au, Pt, Ag, Cr, Fe, Zn, Co, Si, Sn, In, Pb or the like may be formed on the treated surface. The metal thin film 313 can be formed by methods such as vacuum deposition, sputtering, electroless plating, electrolytic plating and so on. The thickness of the metal thin film may be 0.01 $\mu$m to 500 $\mu$m, and more preferably 1 $\mu$m to 200 $\mu$m. Forming a film having a thickness of less than 1 $\mu$m may lead to deterioration of the barrier-ability, and on the other hand forming a film having a thickness of 200 $\mu$m or more by means of, for example, vacuum deposition or electroless plating may lead to higher cost, and there is a concern in that a special technique may be required. Accordingly, forming the metal thin film 313 can improve the air tightness of the tubes.

Here, if the tubes are made of silicone, polyurethane or polypropylene, as described above, the air-tightness thereof can be improved by similarly forming the metal thin film thereon. In this case, treating with hydrogen plasma, as in the case of the fluorocarbon resins, can provide a better metal film having better adhesiveness.

Also, the air-tightness may be improved by applying a coating of a fluorocarbon resin onto the inner surface and the outer surface of the tube of the present invention by electroless plating. The thickness of the fluorocarbon resin coating may be may be 0.01 µm to 500 µm, and more preferably 1 µm to 200 µm. Forming the film having thickness of less than 1 µm may lead to deterioration of the barrier-ability, and on the other hand forming a film having a thickness of 200 µm or more by means of, for example, vacuum deposition or electroless plating may lead to higher cost, and there is a concern that a special technique may be required.

As described above, the present invention provides a cooling device that provides higher flexibility for selecting a suitable device arrangement that achieves a miniaturization and a lower profile, and that has improved cooling performance, electronic apparatuses and acoustic apparatuses employing the cooling device, and methods for producing the cooling device.

What is claimed is:

1. A cooling device comprising:
   a cooling unit, configured to cool an object by vaporizing an operating medium with heat from said object, wherein said cooling unit comprises at least a wick through which the operating medium passes and a surface of said at least a wick is coated with a thin film of copper I oxide;
   a condensing unit, physically separated from said cooling unit, and configured to condense the vaporized operating medium vaporized in said cooling unit and to circulate the condensed operating medium to said cooling unit;
   a first tube, configured to guide the condensed operating medium from said condensing unit to said cooling unit; and
   a second tube, configured to guide the vaporized operating medium from said cooling unit to said condensing unit.

2. The cooling device according to claim 1, wherein said cooling unit comprises:
   a first substrate, provided with a groove except for a wick;
   a second substrate, formed of a metal or a material having a thermal conductivity equivalent to that of a metal, and provided with the at least a wick; and
   a third substrate, having a surface incorporating said second substrate, wherein said surface of said third substrate is joined with said first substrate.

3. The cooling device according to claim 2, wherein said second substrate is formed of copper.

4. The cooling device according to claim 1, wherein at least one of said first tube and said second tube is formed of a fluorocarbon resin.

5. The cooling device according to claim 4, wherein at least one joint of joints between a unit and a tube is coated with a self-bonding fluorocarbon resin, wherein said unit is selected from the group consisting of said cooling unit and said condensing unit, and wherein said tube is selected from the group consisting of said first tube and said second tube.

6. The cooling device according to claim 5, wherein at least one surface of said joint between the tube and the unit is treated with plasma or reactive ion etching, wherein said tube is selected from the group consisting of said first tube and the second tube, and wherein said unit is selected from the group consisting of said cooling unit and said condensing unit.

7. The cooling device according to claim 5, wherein each surface of said joint between the tube and the unit is treated with plasma or reactive ion etching, wherein said tube is selected from the group consisting of said first tube and the second tube, and wherein said unit is selected from the group consisting of said cooling unit and said condensing unit.

8. The cooling device according to claim 1, wherein at least one of the surfaces of said first tube and said second tube has a metal thin film formed thereon.

9. The cooling device according to claim 8, wherein said metal thin film includes at least one element selected from the group consisting of Cu, Al, Ni, Ti, Au, Pt, Ag, Cr, Fe, Zn, Co, Si, Sn, In and Pb.

10. The cooling device according to claim 1, wherein at least one of said first tube and said second tube contains at least one material, selected from the group consisting of silicone rubber, polyurethane, and polypropylene.

11. The cooling device according to claim 10, wherein at least one of outer and inner surfaces of said first tube and said second tube is coated with a fluorocarbon resin.

12. An electronic apparatus comprising:
   a central processing unit;
   a cooling unit, disposed adjacent to said central processing unit, and configured to cool the central processing unit by vaporizing an operating medium with heat from said central processing unit, wherein said cooling unit comprises at least a wick through which the operating medium passes and a surface of said at least a wick is coated with a thin film of copper I oxide;
   a condensing unit, physically separated from said cooling unit, and configured to condense the vaporized operating medium vaporized in said cooling unit and to circulate the condensed operating medium to said cooling unit;
   a first tube, configured to guide the condensed operating medium from said condensing unit to said cooling unit; and
   a second tube, configured to guide the vaporized operating medium from said cooling unit to said condensing unit.

13. The electronic apparatus according to claim 12, wherein said cooling unit has an area that is substantially equal to an area of said central processing unit.

14. An electronic apparatus, having a slot through which a card memory device comprising a flash memory and a driver is capable of being inserted therein or removed therefrom, said electronic apparatus comprising:
   a cooling unit, being disposed adjacent to said slot, and configured to cool an object by vaporizing an operating medium with heat from said object, wherein said cooling unit comprises at least a wick through which the operating medium passes and a surface of said at least a wick is coated with a thin film of copper I oxide;
   a condensing unit, being physically separated from said cooling unit, and configured to condense the vaporized operating medium vaporized in said cooling unit and to circulate the condensed operating medium to said cooling unit;
   a first tube, configured to guide the condensed operating medium from said condensing unit to said cooling unit; and
   a second tube, configured to guide the vaporized operating medium from said cooling unit to said condensing unit.

15. An electronic apparatus, comprising:
   an operating unit having at least a central processing unit;
   a cooling unit, being disposed adjacent to said central processing unit, and configured to cool said central processing unit by vaporizing an operating medium with heat from said central processing unit, wherein said cooling unit comprises at least a wick through which the operating medium passes and a surface of said at least a wick is coated with a thin film of copper I oxide;

a display unit, being physically separated from said cooling unit, and having a condensing unit that is configured to condense the vaporized operating medium vaporized in said cooling unit;

a coupling unit, configured to collapsibly couple a side of said operating unit and a side of said display unit;

a first tube disposed between said condensing unit and said cooling unit by said coupling unit, wherein the condensed operating medium flows from said condensing unit to said cooling unit through said first tube; and a second tube disposed between said condensing unit and said cooling unit by said coupling unit, wherein the vaporized operating medium flows from said cooling unit to said condensing unit through said second tube.

16. An acoustic apparatus, having a power transistor, comprising:

a cooling unit, configured to cool said power transistor by vaporizing an operating medium with heat from said power transistor, wherein said cooling unit comprises at least a wick through which the operating medium passes and a surface of said at least a wick is coated with a thin film of copper I oxide;

a condensing unit, being physically separated from said cooling unit, and configured to condense the vaporized operating medium vaporized in said cooling unit and to circulate the condensed operating medium to said cooling unit;

a first tube, configured to guide the condensed operating medium from said condensing unit to said cooling unit; and a second tube, configured to guide the vaporized operating medium from said cooling unit to said condensing unit.

17. A method for producing a cooling device, comprising:

producing a cooling unit, which is capable of cooling an object by vaporizing an operating medium with heat from said object;

producing at least a wick surface in said cooling unit through which the operating medium passes and coating a surface of said at least a wick with a thin film of copper I oxide;

producing a condensing unit, which is physically separated from said cooling unit, and is capable of condensing the vaporized operating medium vaporized in said cooling unit and circulating the condensed operating medium to said cooling unit;

coupling a first tube between said cooling unit and said condensing unit, wherein the condensed operating medium is capable of flowing from said condensing unit to said cooling unit through said first tube; and coupling a second tube between said cooling unit and said condensing unit, wherein the vaporized operating medium is capable of flowing from said cooling unit to said condensing unit through said second tube.

18. The method according to claim 17, wherein at least one of said first tube and said second tube is formed of a fluorocarbon resin.

19. The method according to claim 18, further comprising:

forming a coating of self-bonding fluorocarbon resin onto at least one joint of joints between a unit and a tube, wherein said unit is selected from the group consisting of said cooling unit and said condensing unit, and wherein said tube is selected from the group consisting of said first tube and said second tube.

20. The method according to claim 18, further comprising:

treating a surface of said fluorocarbon resin with hydrogen plasma.

21. The method according to claim 17, further comprising:

forming a metal thin film on at least one surface of surfaces of said first tube and said second tube.

22. The method according to claim 21, wherein said metal thin film includes at least one element selected from the group consisting of Cu, Al, Ni, Ti, Au, Pt, Ag, Cr, Fe, Zn, Co, Si, Sn, In and Pb.

23. The method according to claim 17, wherein at least one of said first tube and said second tube contains at least one material selected from the group consisting of silicone rubber, polyurethane, and polypropylene.

24. The method according to claim 23, further comprising:

forming a coating of fluorocarbon resin onto at least one of outer and inner surfaces of said first tube and said second tube.

25. A cooling device comprising:

a cooling unit configured to cool an object by vaporizing an operating medium with heat from said object;

a condensing unit, physically separated from said cooling unit, and configured to condense the vaporized operating medium vaporized in said cooling unit and to circulate the condensed operating medium to said cooling unit;

a first tube configured to guide the condensed operating medium from said condensing unit to said cooling unit; and a second tube configured to guide the vaporized operating medium from said cooling unit to said condensing unit, wherein said cooling unit comprises:

a first substrate, provided with a groove except for a wick, a second substrate, formed of a metal or a material having a thermal conductivity equivalent to that of a metal, and provided with at least a wick, and a third substrate, having a surface incorporating said second substrate, wherein said surface of said third substrate is joined with said first substrate, wherein said second substrate is formed of copper, and wherein a thin film of copper I oxide is formed on a surface of said at least a wick.

26. A method for producing a cooling device, comprising:

producing a cooling unit, which is capable of cooling an object by vaporizing an operating medium with heat from said object;

producing a condensing unit, which is physically separated from said cooling unit, and is capable of condensing the vaporized operating medium vaporized in said cooling unit and circulating the condensed operating medium to said cooling unit;

coupling a first tube between said cooling unit and said condensing unit, wherein the condensed operating medium is capable of flowing from said condensing unit to said cooling unit through said first tube;

coupling a second tube between said cooling unit and said condensing unit, wherein the vaporized operating medium is capable of flowing from said cooling unit to said condensing unit through said second tube; and forming a thin film of copper I oxide on a wick surface that is provided on said cooling unit.

* * * * *